US006953650B2

(12) United States Patent
Yoshinari

(10) Patent No.: US 6,953,650 B2
(45) Date of Patent: Oct. 11, 2005

(54) MULTICOLOR IMAGE FORMING MATERIAL

(75) Inventor: Shinichi Yoshinari, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/886,101

(22) Filed: Jul. 8, 2004

(65) Prior Publication Data

US 2005/0014085 A1 Jan. 20, 2005

(30) Foreign Application Priority Data

Jul. 8, 2003 (JP) .................................... P.2003-271836

(51) Int. Cl.$^7$ .............................. G03F 7/34; G03F 7/11

(52) U.S. Cl. .................... 430/200; 430/201; 428/32.69; 428/32.74

(58) Field of Search ........................... 428/32.74, 32.69; 430/200, 201

(56) References Cited

U.S. PATENT DOCUMENTS 4,293,625 A * 10/1981 Myers ........................... 430/9
5,115,457 A * 5/1992 Lewandowski et al. ........ 378/45
5,447,818 A * 9/1995 Naruse et al. .............. 430/214
5,464,723 A * 11/1995 Chou ......................... 430/200
6,190,827 B1 * 2/2001 Weidner ..................... 430/201
6,489,088 B2 * 12/2002 Fukagawa et al. .......... 430/391
6,593,060 B2 * 7/2003 Konuma .................. 430/271.1
6,706,341 B1 * 3/2004 Schnitzel et al. ........ 428/32.69
2002/0187418 A1 * 12/2002 Nakamura et al. .......... 430/200
2004/0053157 A1 * 3/2004 Yoshinari .................... 430/203

FOREIGN PATENT DOCUMENTS

JP 05-058045 A 3/1993
JP 06-219052 A 8/1994
JP 2002-86938 A 3/2003

* cited by examiner

*Primary Examiner*—Richard L. Schilling
(74) *Attorney, Agent, or Firm*—Sughrue Mion, PLLC

(57) ABSTRACT

A laser thermal transfer multicolor image forming material comprising an image-receiving sheet containing an image-receiving layer and a thermal transfer sheet containing a light-to-heat conversion layer, an image-forming layer and a support, which comprises a white thermal transfer sheet containing in the image-forming layer a titanium oxide having a particle size of 0.2 to 0.4 μm with a particle surface being coated by alumina and silica.

8 Claims, 4 Drawing Sheets

FIG. 1-a
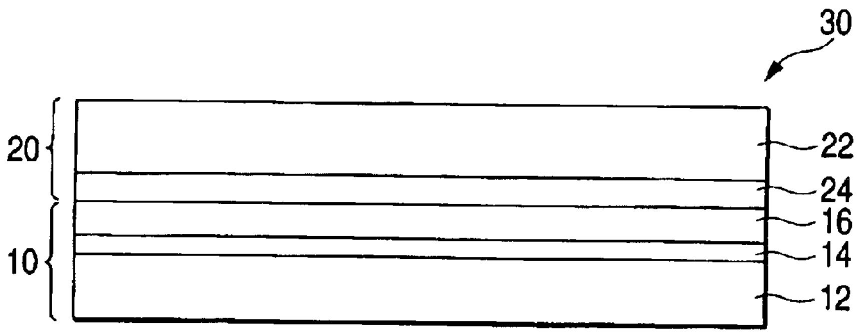
FIG. 1-b
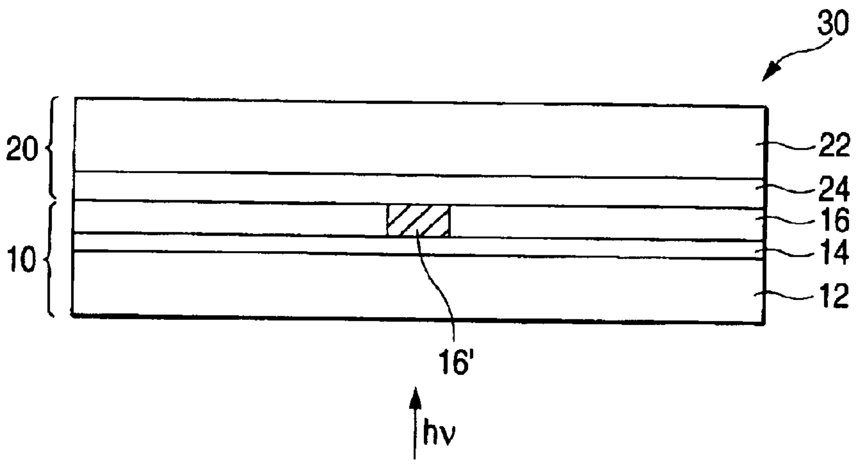
FIG. 1-c
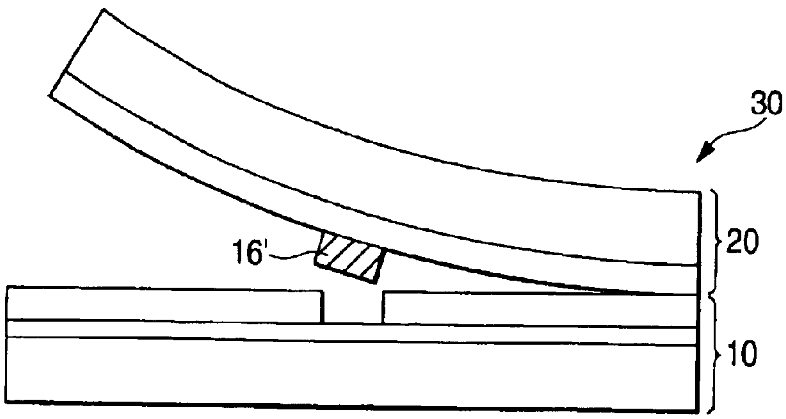

MULTICOLOR IMAGE FORMING MATERIAL

FIELD OF THE INVENTION

The present invention relates to a multicolor image forming material capable of forming a high-resolution color image by using laser light. More specifically, the present invention relates to a multicolor image forming material useful for producing a color proof (DDCP (direct digital color proof) in the printing field or a mask image from digital image signals by laser recording.

BACKGROUND OF THE INVENTION

In the field of graphic art, an image is printed on a printing plate by using a set of color-separation films prepared from a color original with use of a lithographic film. In general, a color proof is produced from the color-separation films before the main printing (i.e., actual printing operation) so as to check for errors in the color separation process or whether color correction or the like is necessary. The color proof is required to realize high resolution for enabling the formation of a halftone image with high reproducibility and to have capabilities such as high process stability. Furthermore, in order to obtain a color proof approximated to an actual printed matter, the materials used for the actual printed matter are preferably used for the materials of the color proof, for example, the substrate is preferably actual printing paper and the coloring material is preferably a pigment. With respect to the method for producing a color proof, a dry process using no liquid developer is highly demanded.

Accompanying recent widespread use of computerized systems in the pre-printing process (in the pre-press field), a recording system of producing a color proof directly from digital signals has been developed as the dry preparation method for a color proof. These computerized systems are configured particularly for the purpose of producing a color proof having high image quality and by these systems, a halftone image of 150 lines/inch or more is generally reproduced. In order to record a proof having high image quality from digital signals, laser light capable of modulating by the digital signals and sharply focusing the recording light is used as the recording head. Accordingly, the image forming material used with the laser is required to exhibit high recording sensitivity to the laser light and high resolution for enabling the reproduction of high-definition halftone dots, With respect to the image forming material for use in the transfer image forming method utilizing laser light, a heat-fusion transfer sheet is known, where a light-to-heat conversion layer capable of absorbing laser light and generating heat and an image-forming layer containing a pigment dispersed in a heat-fusible component such as wax or binder are provided in this order on a support (see, JP-A-5-58045 (the term "JP-A" as used herein means an "unexamined published Japanese patent application")) According to the image forming method using such an image forming material, heat is generated in the region irradiated with laser light of the light-to-heat conversion layer and the image-forming layer corresponding to this region is fused by the heat and transferred to an image-receiving sheet stacked and disposed on the transfer sheet, whereby a transfer image is formed on the image-receiving sheet.

Also, JP-A-6-219052 discloses a thermal transfer sheet where a light-to-heat conversion layer containing a light-to-heat converting substance, a very thin (0.03 to 0.3 $\mu$m) heat release layer and an image-forming layer containing a coloring material are provided in this order on a support. In this thermal transfer sheet, upon irradiation with laser light, the bonding strength between the image-forming layer and the light-to-heat conversion layer bonded through the heat release layer is weakened and a high-definition image is formed on an image-receiving sheet stacked and disposed on the thermal transfer sheet. The image forming method using this thermal transfer sheet utilizes so-called "ablation", more specifically, a phenomenon that a part of the heat release layer in the region irradiated with laser light is decomposed and vaporized and the bonding strength between the image-forming layer and the light-to-heat conversion layer is thereby weakened in that region, as a result, the image-forming layer in that region is transferred to an image-receiving sheet stacked on the thermal transfer sheet.

These image forming methods are advantageous in that an actual printing paper having provided thereon an image-receiving layer (adhesive layer) can be used as the image-receiving sheet material and a multicolor image can be easily obtained by sequentially transferring images of different colors on the image-receiving sheet. Particularly, the image forming method utilizing ablation is advantageous in that a high-definition image can be easily obtained. Therefore, these methods are useful for the production of a color proof (DDCP (direct digital color proof)) or a high-definition mask image.

With the progress of DTP environment, at the site using CTP (computer to plate), the intermediate film output process is not performed and instead of proof printing or analogue proof, demands for proof by DDCP system are increasing. In recent years, a large-size DDCP having higher grade and higher stability and having excellent printing consistency is being demanded.

The laser thermal transfer system can provide printing with high resolution and, for example, (1) a laser sublimation system, (2) a laser ablation system and (3) a laser fusion system have been heretofore known, but these systems all have a problem that the shape of recorded dot is not sharp. The laser sublimation system of (1) is disadvantageous in that the approximation to a printed matter is not satisfied due to use of a dye as the coloring material and since this is a system of causing sublimation of the coloring material, the contour of dot becomes indefinite and the resolution is not sufficiently high. On the other hand, in the laser ablation system, a pigment is used as the coloring material and therefore, the approximation to a printed matter is good, but since this is a system of causing scatter of the coloring material, similarly to the sublimation system, the contour of dot becomes indefinite and the resolution is not sufficiently high. Furthermore, the laser fusion system of (3) has a problem that the fused material flows and a clear contour cannot be obtained.

Also, in the printing field, apart from the color printing on white paper, printing on a transparent support is sometimes performed and this is mainly used for package.

At this time, in order to mask the background surface of a transferee material or prevent see-through of the opposite side of a transparent transferee material, it is required to once transfer a white base color on a transferee material and transfer thereon so-called process colors using four colors of yellow, magenta, cyan and black. To cope with such uses, a white thermal transfer sheet is being demanded also in DDCP.

JP-A-2002-86938 is proposing to use a thermal transfer sheet of special color such as white in DDCP, though this publication is silent on uses for package and the like.

However, in the case of white thermal transfer sheet, when the thickness of the image-forming layer is increased to obtain a high masking power, the sensitivity decreases and unless a higher energy is applied, recording cannot be performed, as a result, there arises a problem in productivity or type of recording machine.

SUMMARY OF THE INVENTION

The present invention has been made to solve these problems in conventional techniques and attain the following objects. That is, an object of the present invention is to provide a multicolor image forming material containing a white thermal transfer sheet having high masking power and high recording sensitivity. Another object of the present invention is to provide a multicolor image forming material and a multicolor image forming method using the same, which can provide a large-size DDCP enlarged in the range of reproducible colors, particularly having white color excellent in the masking power. Still another object of the present invention is to provide a multicolor image forming material capable of giving a large-size DDCP having high grade and, high stability and having excellent printing consistency. Yet still another object of the present invention is to provide a multicolor image forming material capable of forming an image with good image quality and stable transfer density on an image-receiving sheet even when the image is formed by laser recording using multibeam laser light at high energy.

These objects of the present invention can be attained by the following multicolor image forming materials.

(1) A laser thermal transfer multicolor image forming material comprising an image-receiving sheet having an image-receiving layer and a thermal transfer sheet having at least a light-to-heat conversion layer and an image-forming layer on a support, which comprises a white thermal transfer sheet containing in the image-forming layer a titanium oxide having a particle size of 0.2 to 0.4 $\mu$m with the particle surface being coated by alumina and silica.

(2) The laser thermal transfer multicolor image forming material as described in (1) above, wherein the coverage of alumina and silica on the titanium oxide is 5 mass % (weight %) or more.

(3) The laser thermal transfer multicolor image forming material as described in (1) or (2) above, wherein the titanium oxide is a rutile type.

(4) The laser thermal transfer multicolor image forming material as described in any one of (1) to (3) above, wherein in the image-forming layer of the white thermal transfer sheet, when the solid part of the recorded image on the image-forming layer is measured by a visual filter, the ratio (reflection OD/layer thickness) of the reflection optical density (reflection OD) to the layer thickness (unit: $\mu$m) of the image-forming layer is 0.15 or more.

In the multicolor image forming material of the present invention, a titanium oxide having a specific size and a specific surface structure is contained in the image-forming layer of the white thermal transfer sheet, whereby the white thermal transfer sheet can be ensured with recording sensitivity and masking power and a multicolor image with a white base can be effectively produced on a plastic film such as package.

BRIEF DESCRIPTION OF THE DRAWINGS

FIG. 1 (FIGS. 1-*a*; 1-*b* and 1-*c*) A view for roughly explaining the mechanism of the multicolor image formation by thin-film thermal transfer using a laser.

DESCRIPTION OF NUMERICAL REFERENCES

Figure 2:
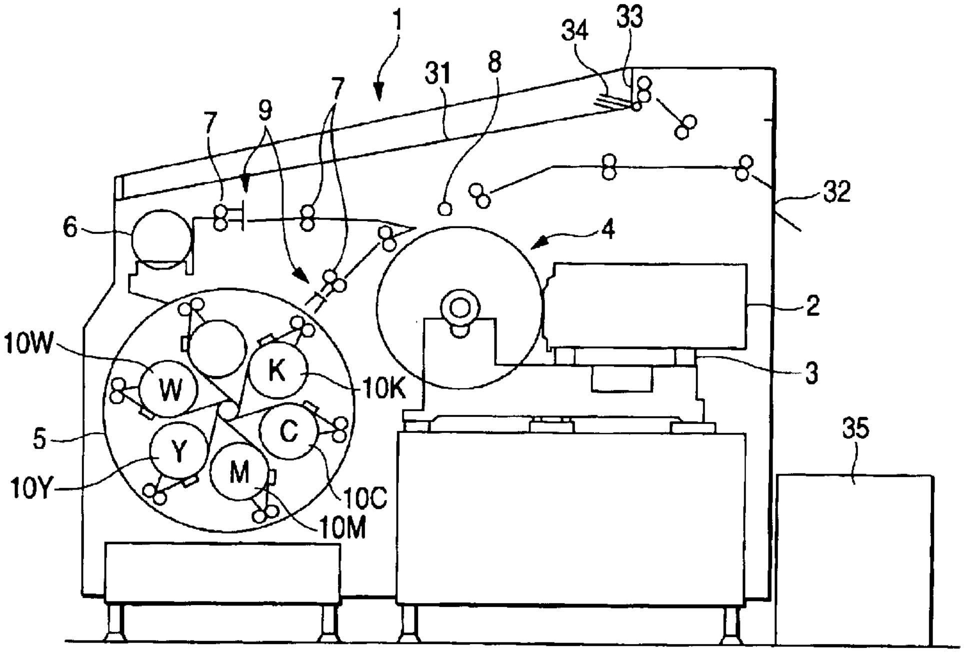
FIG. 2 A view showing a constitution example of the recording apparatus for laser thermal transfer.
Figure 3:
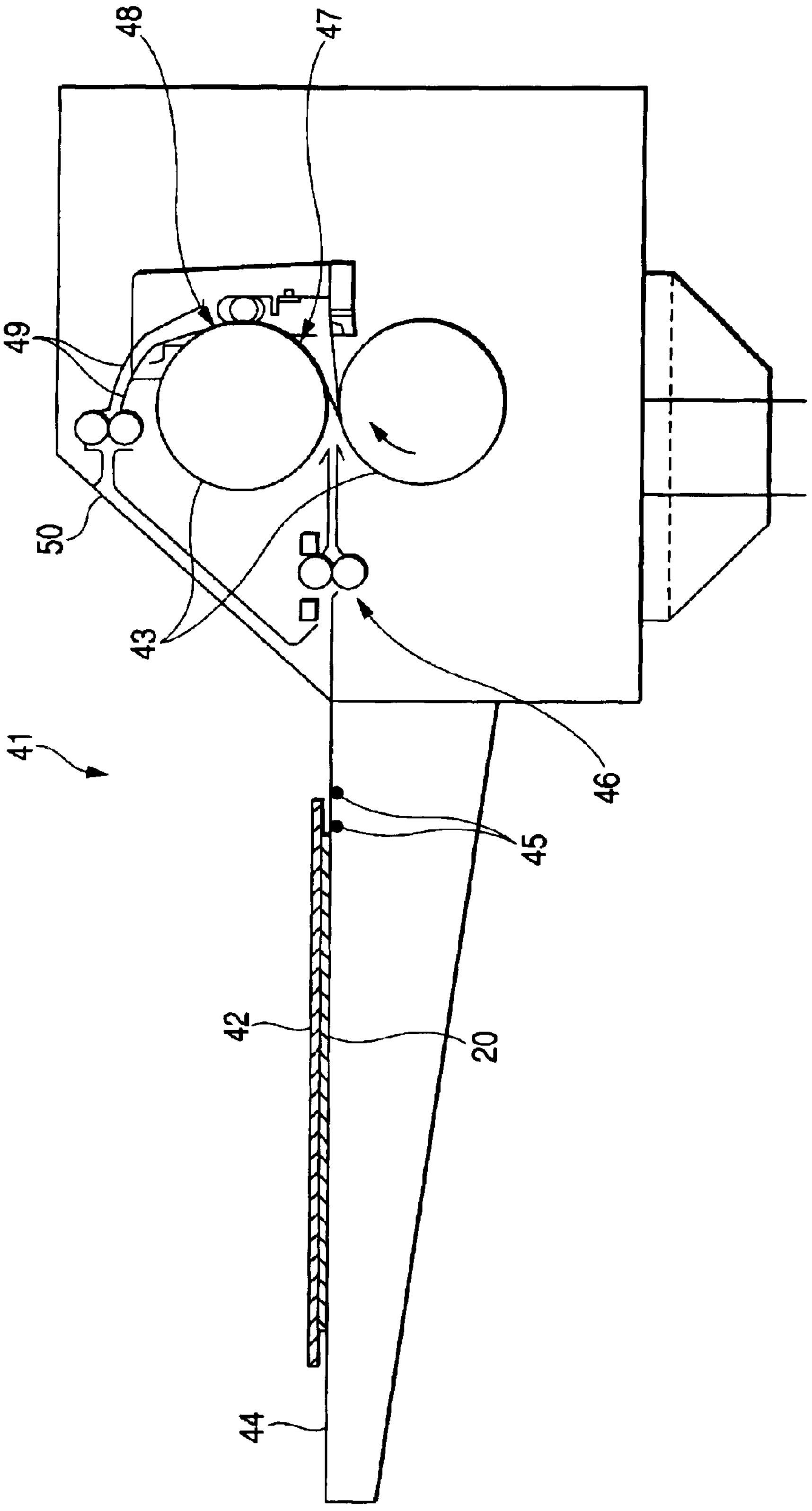
FIG. 3 A view showing a constitution example of the thermal transfer apparatus.

1 Recording apparatus
2 Recording head
3 Sub-scanning rail
4 Recording drum
5 Thermal transfer sheet loading unit
6 Image-receiving sheet roll
7 Transportation roller
8 Squeeze roller
9 Cutter
10 Thermal transfer sheet
10K, 10C, 10M, 10Y, 10W Thermal transfer sheet roll
12 Support
14 Light-to-heat conversion layer
16 Image-forming layer
20 Image-receiving sheet
22 Support for image-receiving sheet
24 Image-receiving layer
30 Laminate body
31 Discharge table
32 Discard port
33 Discharge port
34 Air
35 Discard box
42 Transferee
43 Heat roller
44 Insertion table
45 Mark showing the position where the sheet is placed
46 Insertion roller
47 Guide formed of heat-resistant sheet
48 Separation claw
49 Guide plate
50 Discharge port

DETAILED DESCRIPTION OF THE INVENTION

As a result of intensive investigations to provide a large-size DDCP in a size of B2/A2 or more, even B1/A1 or more, and having high grade/high stability and excellent printing consistency, the present inventors have developed a laser thermal transfer recording system for DDCP, comprising an actual paper transfer/actual dot output/pigment-type image-forming material of B2 size or more, an output device and a high-grade CMS soft.

The characteristic performances, system construction and technical points of the laser thermal transfer recording system developed by the present inventors are as follows. The characteristic performances are that (1) the dot shape is sharp and therefore, halftone dots excellent in the approximation to a printed matter can be reproduced; (2) the color hue has good approximation to a printed matter; and (3) the recording quality is unsusceptible to ambient temperature and humidity and the repeated reproducibility is good, so that a stable proof can be produced. The technical points for obtaining a material having such characteristic performances are the establishment of thin-film transfer technique and the improvement of vacuum-contact holding property, follow-ability to high-resolution recording, and heat resistance required of the material for use in the laser thermal transfer system. More specifically, these are, for example, (1) to form the light-to-heat conversion layer as a thin film by introducing an infrared absorbing dye, (2) to enhance the heat resistance of the light-to-heat conversion layer by introducing a high Tg polymer, (3) to stabilize the color hue by introducing a heat-resistant pigment, (4) to control the adhesive strength/cohesive strength by adding a low molecular component such as wax and inorganic pigment, and (5) to impart vacuum contact property without causing deterioration of the image quality by adding a matting agent to the light-to-heat conversion layer. The technical point of the system includes, for example, (1) air conveyance in the recording apparatus for continuously accumulating a large number of sheets, (2) upper insertion of actual paper in the thermal transfer apparatus for reducing curling after the transfer, and (3) connection of a general-purpose output driver connectable and expandable to the system. In this way, the laser thermal transfer recording system developed by the present inventors are constituted by various characteristic performances, system construction and technical points. However, these are examples and the present invention is not limited to these techniques.

The present inventors have conducted the development based on the thinking that respective raw materials, respective coated layers such as light-to-heat conversion layer, thermal transfer layer and image-receiving layer, respective thermal transfer sheets and the image-receiving sheet must be arranged to organically and synthetically function but not to be individually present at random and also that this image forming material exerts the maximum performance when combined with a recording apparatus or a thermal transfer apparatus. The present inventors have intensively studied on raw materials constituting each coated layer of the image forming material and produced an image forming material by forming coated layers to maximally bring out the characteristic features of these raw materials, as a result, found proper ranges of various physical properties where the image-forming material exerts the maximum performance. Based on this finding, the relationship in respective raw materials, respective coated layers, respective sheets and physical properties is elucidated and the image forming material is arranged with a recording apparatus or a thermal transfer apparatus to organically and synthetically function, whereby a high-performance image forming material can be unexpectedly discovered.

As for the position of the present invention in this system developed by the present inventors, a multicolor image forming material suitable for the system is provided and this is an important invention capable of providing a multicolor image particularly by using a thermal transfer sheet containing a surface-treated titanium oxide having a specific particle size as the white pigment.

The multicolor image forming material of the present invention is constituted by at least two (one is white) thermal transfer sheets having image-forming layers differing from each other in the color, and an image-receiving sheet. The multicolor image forming material preferably uses four or more, more preferably five or more, thermal transfer sheets having image-forming layers differing from each other in the color. In the case of using four thermal transfer sheets, the colors of the image-forming layers are yellow (Y), magenta (M), cyan (C) and white (W) and in the case of five thermal transfer sheets, black (K) is added to those colors of the image-forming layers.

Other than these, a thermal transfer sheet having a color incapable of expressing by the combination of process colors, such as green (G), orange (O), red (R), blue (B), gold (Go), silver (S) and pink (P), may also be used.

The present invention is characterized in that at least one color thermal transfer sheet out of these colors is a white thermal transfer sheet (hereinafter sometimes referred to as a "thermal transfer sheet W") and the image-forming layer thereof contains, as the white pigment, a titanium oxide having a particle size of 0.2 to 0.4 μm with the particle surface being coated by alumina and silica (hereinafter sometimes, referred to as a "titanium oxide for the present invention").

In the present invention, by using such a thermal transfer sheet W, a multicolor image forming material can be designed without decreasing the sensitivity.

The particle size of the titanium oxide for the present invention is obtained by measuring the coated particle and determined by calculating the mass average particle size from the data of measurement by TEM.

The coverage of alumina and silica on the titanium oxide must be, in terms of the ratio to the coated titanium oxide, 5 mass % or more but is preferably from 6 to 9 mass %.

The titanium oxide is preferably a rutile type.

In the present invention, by the use of titanium oxide for the present invention, the ratio (reflection OD/layer thickness) of the reflection optical density (reflection OD) to the layer thickness (unit: μm) of the image-forming layer when the solid part of the recorded image on the image-forming layer is measured by a visual filter can be made to 0.15 or more, preferably 0.16 or more. In determining this reflection OD, a solid image recorded on a transparent transferee is measured on a black backing. The reflection OD can be measured, for example, by X-rite 938. As the reflection OD is smaller, the white color is thicker, that is, the masking property is higher, more specifically, unnecessary colors are less seen through the image formed on the transferee and only the image formed by thermal transfer can be more clearly seen, but the reflection OD is preferably on the order of 0.35 or more.

Accordingly, the image-forming layer thickness of the thermal transfer sheet W for use in the present invention is preferably 2.0 μm or less, more preferably 1.5 μm or less. In the present invention, the layer thickness can be made relatively small, so that both the masking power and the recording sensitivity can be ensured.

As for the white pigment contained in the image-forming layer of the thermal transfer sheet W, the titanium oxide for the present invention can be used in combination with calcium carbonate, calcium sulfate or the like within the range of maintaining the effect of the present invention.

In the present invention, the image-forming layer of each thermal transfer sheet and the image-receiving layer of the image-receiving sheet each preferably has a contact angle to water of 7.0 to 120.0°, more preferably from 30.0 to 100.0°. The contact angle is an index regarding compatibility between the image-forming layer and the image-receiving layer, that is, transferability. Also, the contact angle to water of the image-receiving layer is preferably 86° or less. The contact angle in this range is preferred because the transfer sensitivity can be elevated and the temperature and humidity dependency of recording properties can be made small.

The contact angle to water on the surface of each layer for use in the present invention is a value measured by using Contact Angle Meter, Model CA-A (manufactured by Kyowa Interface Science Co., Ltd.).

The characteristic feature of the present invention is that by controlling the physical properties of the thermal transfer sheet, a recorded image can be formed in a larger screen. The recorded area of multicolor image is preferably in a size of 515 mm or more×728 mm or more, more preferably 594 or more×841 mm or more. The size of the image-receiving sheet is preferably 465 or more×686 mm or more.

In the present invention, the ratio $OD_I/T_I$ (unit: μm) of the optical density ($OD_I$) of the image-forming layer in the thermal transfer sheet except for the thermal transfer sheet W to the layer thickness $T_I$ of the image-forming layer is preferably 1.6 or more, more preferably 1.8 or more, still more preferably 2.50 or more. The upper limit of $OD_I/T_I$ is not particularly limited and a larger ratio is more preferred, but by taking account of balance with other properties, the upper limit is about 6 at present.

The $OD_I/T_I$ is an index for the transfer density of the image-forming layer and the resolution of the transferred image. With $OD_I/T_I$ in the above-described range, an image having high transfer density and good resolution can be obtained. Also, by making thinner the image-forming layer, the color reproducibility can be enhanced.

The $OD_I$ indicates a reflection optical density obtained when an image transferred on the image-receiving sheet from the thermal transfer sheet is further transferred on an actual paper sheet, Tokuryo Art Paper, and measured by a densitometer (X-rite 938, manufactured by X-Rite) in each color mode of yellow (Y), magenta (M), cyan (C), black (K) or the like. That is, $OD_I$ of each thermal transfer sheet for an arbitrary color excluding W for use in the present invention means a maximum value when measured through a red filter (filter for cyan), a blue filter (filter for yellow) or a green filter (filter for magenta).

$OD_I$ is preferably from 0.5 to 3.0, more preferably from 0.8 to 2.0.

In the present invention, the ratio $OD_{LH}/T_{LH}$ (unit: μm) of the optical density ($OD_{LH}$) of the light-to-heat conversion layer in the thermal transfer sheet to the layer thickness $T_{LH}$ of the light-to-heat conversion layer is preferably controlled to 4.36 or more. The upper limit of $OD_{LH}/T_{LH}$ is not particularly limited and a larger ratio is more preferred, but by taking account of balance with other properties, the upper limit is about 10 at present.

The $OD_{LH}$ of the thermal transfer sheet for use in the present invention means an absorbance of the light-to-heat conversion layer at a peak wavelength of laser light used on performing the recording by using the image forming material of the present invention and can be measured by using a known spectrophotometer. In the present invention, UV-Spectrophotometer UV-240 manufactured by Shimadzu Corporation was used. The $OD_{LH}$ is a value obtained by subtracting the value of a support alone from the value including the support.

The $OD_{LH}/T_{LH}$ relates to thermal conductivity at the recording and becomes an index greatly governing the temperature and humidity dependency of sensitivity and recording. With $OD_{LH}/T_{LH}$ in the above-described range, the transfer sensitivity on the image-receiving sheet at the recording is elevated and at the same time, the temperature and humidity dependency at the recording can be decreased.

That is, by increasing $OD_{LH}/T_{LH}$, an image can be recorded in a large size as described above with a resolution of transferred image of preferably 2,400 dpi or more, more preferably 2,600 dpi or more.

The layer thickness of the light-to-heat conversion layer is preferably from 0.03 to 1.0 μm, more preferably from 0.05 to 0.5 μm.

In the present invention, the light-to-heat conversion layer of at least one color thermal transfer sheet preferably contains a polyamideimide resin binder and a cyanine-base dye having a sulfonic acid group.

The cyanine-base dye having a sulfonic acid group has high stability and is less decomposable. Also, this dye has high affinity for polyamideimide and is prevented from transfer to the image-forming layer, which gives an effect of preventing the color phase from fluctuation between before and after the transfer to an image-forming layer. Furthermore, when these binder and dye both are contained, this is advantageous in that the coating solution for the light-to-heat conversion layer has excellent aging stability.

In the system of the present invention, a thin-film thermal transfer system is invented and employed, whereby high resolution and high image quality can be achieved. In the system of the present invention, a transferred image having a resolution of 2,400 dpi or more, preferably 2,600 dpi or more, can be obtained. The thin-film thermal transfer system is a system where a thin-film image-forming layer having a layer thickness of 0.01 to 0.9 μm is transferred on an image-receiving sheet while the image-forming layer is in the partially unfused state or scarcely fused state. That is, a thermal transfer system where the recorded portion is transferred as a thin film to ensure very high resolution has been developed. For efficiently performing the thin-film thermal transfer, it is preferred to deform the inside of the light-to-heat conversion layer into a dome shape by optical recording to push up the image-forming layer and increase the adhesive strength between the image-forming layer and the image-receiving layer, thereby facilitating the transfer. When this deformation is large, the force pressing the image-forming layer to the image-receiving layer becomes large and the transfer is facilitated. On the other hand, if the deformation is small, the force of pressing the image-forming layer to the image-receiving layer becomes small and insufficient transfer occurs in some portions. The deformation preferred for the thin-film transfer can be evaluated by the percentage deformation calculated, when observed through a laser microscope (VK8500, manufactured by Keyence Corp.), by adding a cross-sectional area (a) increased after optical recording in the recorded part of the light-to-heat conversion layer to a cross-sectional area (b) before optical recording in the recorded part of the light-to-heat conversion layer, dividing the obtained value by the cross-sectional area (b) before optical recording in the recorded part of the light-to-heat conversion layer, and multiplying the resulting value by 100, that is, percentage deformation=$\{(a+b)/(b)\}\times 100$. The percentage deformation is 110% or more, preferably 125% or more, more preferably 150% or more. When the elongation at break is large, the percentage deformation may exceed 250%, but it is usually preferred to limit the percentage deformation up to about 250%.

The technical points of the image forming material in the thin-film transfer are as follows.

1. Establishment of both High Heat Responsibility and Storability

In order to achieve high image quality, transfer of a thin film on the sub-micron order is necessary but in order to obtain a desired density, a layer having dispersed therein a pigment at a high concentration is necessary and this conflicts with the heat responsibility. The heat responsibility is in a conflicting relationship also with the storability (adhesion). These conflicting relationships have been overcome by developing novel polymers and additives.

2. Securement of High Vacuum Contact Property

In the thin-film transfer pursuing high resolution, the transfer interface is preferably smooth, but if smooth, sufficiently high vacuum contact, property cannot be obtained. Without being constrained by conventional common knowledge for imparting vacuum contact property, a slightly larger amount of a matting agent having a relatively small particle size was incorporated into a layer underlying the image-forming layer, whereby an appropriate gab was uniformly kept between the thermal transfer sheet and the image-receiving sheet, the slippage of image due to the matting agent was prevented from occurring and the vacuum contact property was imparted while ensuring the characteristic features of the thin-film transfer.

3. Use of Heat-Resistant Organic Material

At the laser recording, the light-to-heat conversion layer of converting the laser light into heat reaches a temperature as high as about 700° C. and the image-forming layer reaches a temperature as high as about 500° C. A resin capable of organic solvent coating was developed as the raw material for the light-to-heat conversion layer and at the same time, a safe pigment having heat resistance higher than the pigment for printing and having matched color hue was developed.

4. Securement of Surface Cleanliness

In the thin-film transfer, dusts between the thermal transfer sheet and the image-receiving sheet become image defects and this is a serious problem. Dusts are intruding from the outside of equipment or generated at the cutting of material and cannot be sufficiently cleaned only by the material control and a mechanism of removing dusts must be equipped to the equipment. However, a raw material capable of cleaning the transfer material surface and maintaining appropriate tackiness was found and by changing the construction material of conveyance roller, removal of dusts was realized without decreasing the productivity.

The entire of the system of the present invention is described in detail below.

In the present invention, it is preferred that the above-described large-size thermal transfer image by sharp halftone dots is realized and at the same time, transfer to actual paper can be performed.

A first characteristic performance of the system developed by the present invention is that a sharp dot shape can be obtained. The thermal transfer image obtained by this system can be a halftone image according to the number of printing lines with a resolution of 2,400 dpi or more. Individual dots are almost free of blurring/missing and have a very sharp shape and therefore, dots over a wide range from highlight to shadow can be clearly formed. As a result, a high-grade halftone image can be output with the same resolution as the image setter or CTP setter and the reproduced halftone image and gradation can have good approximation to a printed matter.

A second characteristic performance of the system developed by the present invention is that the repeated reproducibility is good. This thermal transfer image is favored with a sharp dot shape and therefore, a halftone image responding to a laser beam can be faithfully reproduced. Also, this thermal transfer image is very small in the ambient temperature and humidity dependency of the recording property and therefore, the color hue and the density both can be stably and repeatedly reproduced in an environment over a wide range of temperature and humidity.

A third characteristic performance of the system developed by the present invention is that the color reproducibility is good. The thermal transfer image obtained by this system is formed using a color pigment for use in the printing ink and has good repeated reproducibility and therefore, a high-definition CMS (color management system) can be realized.

In addition, this thermal transfer image can be closely matched with the color hue such as Japan color and SWOP color, namely, the color hue of a printed matter, and when the light source such as fluorescent lamp or incandescent lamp is changed, the viewing of color can provide the same change as in a printed matter.

A fourth characteristic performance of the system developed by the present invention is that the letter quality is good. In the thermal transfer image obtained by this system, the dot shape is sharp and therefore, thin lines of a fine letter can be sharply reproduced.

The characteristic feature of the material technique in the system of the present invention is described in detail below. The thermal transfer system for DDCP includes (1) a sublimation system, (2) an ablation system and (3) a heat-fusion system. The systems of (1) and (2) are a system of causing sublimation or scatter of the coloring material and therefore, the contour of dot becomes indefinite. Also, in the system of (3), the fused material flows and therefore, a clear contour cannot be obtained. Based on the thin-film transfer technique, the present inventors incorporated the following techniques so as to overcome new problems in the laser thermal transfer system and obtain higher image quality. A first characteristic feature of the material technique is the sharpening of dot shape. The light-to-heat conversion layer converts laser light into heat and transmits the heat to the adjacent image-forming layer to cause adhesion of the image-forming layer to the image-receiving layer, whereby the image recording is performed. The heat generated by laser light does not diffuse in the plane direction but is transmitted to the transfer interface and the image-forming layer is sharply broken at the interface of heated part/non-heated part. Therefore, for sharpening the dot shape, the light-to-heat conversion layer in the thermal transfer sheet is made thin and the dynamic property of the image-forming layer is controlled.

Technique 1 for the sharpening of dot shape is the thinning of light-to-heat conversion layer. In a simulation, the light-to-heat conversion layer is estimated to momentarily reach about 700° C. and if the film is thin, deformation or destruction readily occurs. If deformation or destruction occurs, the light-to-heat conversion layer is transferred to the image-receiving sheet together with the transfer layer or a non-uniform transferred image is disadvantageously formed. On the other hand, for obtaining a predetermined temperature, a light-to-heat converting substance must be present in a high concentration in the film and this causes a problem such as precipitation of dye or migration of dye into an adjacent layer. Conventionally, carbon is used as the light-to-heat converting substance in many cases, but in the material of the present invention, an infrared absorbing dye which can be used in a small amount as compared with carbon is used. As for the binder, a resin having a sufficiently large dynamic strength even at high temperatures and capable of successfully holding the infrared absorbing dye is introduced.

In this way, by selecting an infrared absorbing dye having excellent light-to-heat conversion property and a heat-resistant binder such as polyamideimide, the light-to-heat conversion layer is preferably thinned to about 0.5 μm or less.

Furthermore, by using an infrared absorbing dye and a polyamideimide-base compound in combination in the light-to-heat conversion layer, the coating solution for the light-to-heat conversion layer can have good aging stability, and reduction in the absorbance after aging can be prevented. Moreover, the absorbance and sensitivity of the light-to-heat conversion layer are elevated, the color hue less fluctuates after exposure and the light fastness is enhanced.

Technique 2 for the sharpening of dot shape is the improvement of property of the image-forming layer. When the light-to-heat conversion layer is deformed or the image-forming layer itself is deformed due to high temperature, the image-forming layer transferred to the image-receiving layer causes unevenness in the thickness correspondingly to the sub-scanning pattern of laser light, as a result, the image becomes non-uniform and the apparent transfer density decreases. This tendency is stronger as the thickness of the image-forming layer is smaller, but if the thickness of the image-forming layer is large, the sharpness of dot is impaired and the sensitivity becomes low.

In order to establish both of these conflicting performances, a low melting point substance such as wax is preferably added to the image-forming layer to improve the transfer unevenness. Also, an inorganic fine particle may be added instead of the binder to properly increase the layer thickness and cause sharp breakage of the image-forming layer at the interface of heated part/non-heated part, whereby the transfer unevenness can be improved while maintaining the sharpness of dot and the sensitivity.

The low melting point substance such as wax is generally liable to bleed out to the image-forming layer surface or undertake crystallization and sometimes causes a problem in the image quality or aging stability of the thermal transfer sheet.

In order to solve these problems, a low melting point substance having a small difference in the Sp value from the polymer of the image-forming layer is preferably used. By using such a substance, the compatibility with the polymer is increased and separation of the low melting point substance from the image-forming layer can be prevented. Also, several kinds of low melting point substances differing in the structure are preferably mixed to form an eutectic crystal and prevent crystallization, whereby an image having a sharp dot shape and reduced in the unevenness can be obtained.

A second characteristic feature of the material technique is in the finding that the recording sensitivity has temperature and humidity dependency. In general, when the coated layer of the thermal transfer sheet absorbs moisture, the dynamic property and thermal property of the layer are changed to bring about dependency on humidity in the recording environment.

In order to reduce this temperature and humidity dependency, an organic solvent system is preferably used for the dye/binder system of the light-to-heat conversion layer and for the binder system of the image-forming layer. It is also preferred to select polyvinyl butyral as the binder of the image-receiving layer and at the same time, introduce a polymer hydrophobizing technique so as to reduce the water absorptivity of the polymer. Examples of the polymer hydrophobizing technique include a technique of reacting a hydroxyl group with a hydrophobic group described in JP-A-8-238858 and a technique of crosslinking two or more hydroxyl groups with a hardening agent.

A third characteristic feature of the material technique is the improvement of the approximation of color hue to a printed matter. In addition to the technique for color matching and stable dispersion of a pigment in the color proof (for example, First Proof produced by Fuji Photo Film Co., Ltd.) by thermal head system, the following problems newly occurred in the laser thermal transfer system were solved. That is, Technique 1 for the improvement of the approximation of color hue to a printed matter is the use of a highly heat-resistant pigment. Usually, the image-forming layer is also heated to about 500° C. or more at the printing by laser exposure and some pigments heretofore used are thermally decomposed, but this can be prevented by employing a highly heat-resistant pigment in the image-forming layer.

Technique 2 for the improvement of the approximation of color hue to a printed matter is to prevent diffusion of the infrared absorbing dye. When the infrared absorbing dye migrates into the image-forming layer from the light-to-heat conversion layer due to heat of high temperature at the printing, the color hue is changed. In order to prevent this, the light-to-heat conversion layer is preferably designed by using an infrared absorbing dye/binder combination having a strong holding power as described above.

A fourth characteristic feature of the material technique is the elevation of sensitivity. In general, energy shortage occurs at the high-speed printing and particularly, gaps corresponding to intervals of the laser sub-scanning are generated. As described above, efficiency in the generation/transmission of heat can be elevated by increasing the concentration of dye in the light-to-heat conversion layer and reducing the thickness of the light-to-heat conversion layer•image-forming layer. Furthermore, for the purpose of slightly fluidizing the image-forming layer at the heating to fill the gaps and strengthening the adhesion to the image-receiving layer, a low melting point substance is preferably added to the image-forming layer. Also, for intensifying the adhesion between the image-receiving layer and the image-forming layer and imparting a sufficiently high strength to the transferred image, for example, the same polyvinyl butyral as used in the image-forming layer is preferably employed for the binder of the image-receiving layer.

A fifth characteristic feature of the material technique is the improvement of vacuum contact-property. The image-receiving sheet and the thermal transfer sheet are preferably held on a drum by vacuum contact. This vacuum contact is important because the image is formed by controlling the adhesive strength between two sheets and the image transfer behavior is very sensitive to the clearance between the image-receiving layer surface of the image-receiving sheet and the image-forming layer surface of the transfer sheet. When widening of the clearance between materials is triggered by a foreign matter such as dust, this causes image defects or image transfer unevenness.

In order to prevent such image defects or image transfer unevenness, uniform asperities are preferably formed on the thermal transfer sheet to smoothly pass air and obtain a uniform clearance.

Technique 1 for the improvement of vacuum contact property is the formation of asperities on the thermal transfer sheet. The asperities are formed on the thermal transfer sheet so as to sufficiently bring out the vacuum-contact effect even in the superposed printing of two or more colors. The asperities may be formed on the thermal transfer sheet by a post-treatment such as embossing or by the addition of a matting agent to the coated layer, but in view of simplification of the production process and aging stability of the material, addition of a matting agent is preferred. The matting agent must be larger than the thickness of the coated layer. When the matting agent is added to the image-forming layer, there arises a problem that the image in the portion where the matting is present is missed. Therefore, a matting agent having an optimal particle size is preferably added to the light-to-heat conversion layer, whereby the image-forming layer itself can have an almost uniform thickness and an image free of defects can be obtained on the image-receiving sheet.

The characteristic features of the systematization technique for the system of the present invention are described below. Feature 1 of the systematization technique is the constitution of recording apparatus. In order to reproduce the above-described sharp dots without fail, a high-precision design is required also in the recording apparatus side. The fundamental constitution is the same as conventional laser thermal transfer recording apparatus. This constitution is a so-called heat-mode outer drum recording system where a recording head with a plurality of high-power lasers irradiates laser light on a thermal transfer sheet and an image-receiving sheet, which are fixed on a drum, and thereby an image is recorded. In particular, the following embodiments are preferred.

Constitution 1 of the recording apparatus is to avoid intrusion of dusts. The image-receiving sheet and thermal transfer sheet are fed by full automatic roll feeding. In the case of feeding a small number of sheets, dusts generated from human body intrude in many cases and therefore, roll feeding was employed.

One roll is provided every each color thermal transfer sheet and the roll for each color is changed over by the rotation of a loading unit. Each film is cut to a predetermined length by a cutter during loading and then fixed on a drum. Constitution 2 of the recording apparatus is to intensify the adhesion between the image-receiving sheet and the thermal transfer sheet on the recording drum. The image-receiving sheet and thermal transfer sheet are fixed on the recording drum by vacuum contact. By the mechanical fixing, the adhesive strength between the image-receiving sheet and the thermal transfer sheet cannot be increased and therefore, vacuum contact was employed. A large number of vacuum adsorption holes are formed on a recording drum and the sheet is adsorbed to the drum by reducing the pressure inside the drum using a blower or a pressure reducing pump. The thermal transfer sheet is further adsorbed over the image-receiving sheet which is already adsorbed. Therefore, the size of the heat-transfer sheet is made larger than that of the image-receiving sheet. The air between the thermal transfer sheet and the image-receiving sheet, which most greatly affects the recording performance, is suctioned from the area outside the image-receiving sheet, where only the thermal transfer sheet is adsorbed.

Constitution 3 of the recording apparatus is to stably accumulate a plurality of sheets on a discharge table. In this apparatus, many large-area sheets of B2 size can be accumulated one on another on the discharge table, When a sheet B is discharged on the image-receiving layer of a previously accumulated sheet A having heat adhesive property, these two sheets may stick to each other. If stuck, the next sheet cannot be regularly discharged and jamming is caused. For preventing the sticking, it is optimal to prevent the contact between sheets A and B. As for the technique for preventing the contact, there are known several methods such as (a) a method of providing a step in the discharge table to unflatten the sheet shape and thereby form a gap between sheets, (b) a method of providing the discharge port at the position higher than the discharge table to constitute a structure of dropping the discharge sheet from above, and (c) a method of jetting out an air between two sheets to float the sheet discharged later. In the system to which the present invention is applied, the sheet size is as large as B2 and when the methods of (a) and (b) are employed, the structure becomes very large. Therefore, the air jetting out method of (c) was employed. That is, a method of jetting out an air between two sheets to float the sheet discharged later is employed.

FIG. 2 shows a constitution example of this apparatus.

The sequence of forming a full color image by applying the image forming material to this apparatus (hereinafter referred to as an "image formation sequence of this system") is described below.

1) In a recording apparatus 1, the sub-scan axis of a recording head 2 is returned to the original point by means of a sub-scan rail 3, and the main scan rotation axis of a recording drum 4 and a thermal transfer sheet loading unit 5 are also returned to respective original points.

2) An image-receiving sheet roll 6 is untied by a transportation roller 7 and the leading end of the image-receiving sheet is vacuum-suctioned through suction holes provided on the recording drum 4 and fixed on the recording drum.

3) A squeeze roller 8 comes down on the recording drum 4 to press the image-receiving sheet and stops pressing when a predetermined amount of the image-receiving sheet is transported by the rotation of the drum, and the image-receiving sheet is cut by a cutter 9 to a predetermined length.

4) The recording drum 4 continues rotating to make one rotation and thereby, the loading of the image-receiving sheet is completed.

5) By the same sequence as that for the image-receiving sheet, a thermal transfer sheet having a first color (black) (hereinafter sometimes referred to as a "thermal transfer sheet K"; the same applies to other colors) is drawn out from the thermal transfer sheet roll 10K and cut to complete the loading.

6) Then, the recording drum 4 starts rotating at a high speed, the recording head 2 on the sub-scan rail 3 starts moving and when the recording head reaches a recording start position, a recording laser is irradiated on the recording drum 4 by the recording head 2 according to the recording image signals. The irradiation is finished at the recording end position, and the moving of sub-scan rail and the rotation of drum are stopped. The recording head on the sub-scan rail is returned to the original point.

7) While leaving the image-receiving sheet on the recording drum, only the thermal transfer sheet K is peeled off. The leading end of the thermal transfer sheet K is hooked by a claw, pulled out to the discharge direction and discarded in a discard box 35 through a discard port 32.

8) The operations 5) to 7) are repeated for remaining color portions. The recording order subsequent to black is, for example, cyan, magenta, yellow and white. More specifically, a thermal transfer sheet C having a second color (cyan), a thermal transfer sheet M having a third color (magenta), a thermal transfer sheet Y having a fourth color (yellow) and a thermal transfer sheet W having a fifth color (white) are sequentially drawn out from a thermal transfer sheet roll 10C, a thermal transfer sheet roll 10M, a thermal transfer sheet roll 10Y and a thermal transfer sheet roll 10W, respectively. The transfer order is opposite to the general printing order and this is, because at the transfer on a transferee such as plastic film or actual paper in the later step, the color order on the transferee is reversed. Incidentally, the above-described recording order is not particularly limited.

9) After the completion of these steps, the recorded image-receiving sheet is finally discharged to a discharge table 31. The separation of the image-receiving sheet from the drum is performed in the same manner as the thermal transfer sheet in 7), but unlike the thermal transfer sheet, the image-receiving sheet is not discarded and therefore, when transported until the discard port 32, the image-receiving sheet is returned to the discharge table by means of switch back. On discharging the image-receiving sheet to the discharge table, air 34 is jetted out from the lower part of a discharge port 33, so that a plurality of sheets can be accumulated.

An adhesive roller having provided on the surface thereof an adhesive material is preferably used for any one transportation roller 7 disposed at the positions of feeding or transporting the thermal transfer sheet roll or the image-receiving sheet roll.

By providing an adhesive roller, the surfaces of the thermal transfer sheet and the image-receiving sheet can be cleaned.

Examples of the adhesive material provided on the surface of the adhesive roller include an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic acid ester copolymer, a polyester resin, a polyurethane resin, an acrylic resin, a butyl rubber and a polynorbornene.

The adhesive roller is put into contact with the surface of the thermal transfer sheet or the image-receiving sheet, whereby the surface can be cleaned. The contact pressure is not particularly limited as long as the roller is contacted with the sheet.

The material having tackiness for use on the adhesive roller preferably has a Vickers hardness Hv of 50 kg/mm$^2$ (about 490 MPa) or less, because dusts as a foreign matter can be satisfactorily removed and the generation of image defects can be prevented.

The Vickers hardness is a hardness obtained when a static load is imposed on a regular quadrangular pyramid-shaped diamond indenter having a diagonal angle of 136° and the hardness is measured. The Vickers hardness Hv can be determined by the following formula:

$$\text{Hardness } Hv=1.854\ P/d^2\ (\text{kg/mm}^2)=\text{about } 18.1692\ d^2\ (\text{MPa})$$

wherein

P: size of load (kg), d: length of diagonal line of a square dent (mm).

In the present invention, the material having tackiness for use on the adhesive roller preferably has an elastic modulus of 200 kg/cm$^2$ (about 19.6 MPa) or less at 20° C., because, similarly to the above, dusts as a foreign matter can be satisfactorily removed and the generation of image defects can be prevented.

Feature 2 of the systematization technique is the constitution of thermal transfer apparatus.

For performing a step of transferring the image-receiving sheet having printed thereon an image by the recording apparatus on a transferee such as plastic film or actual printing paper (hereinafter referred to as "actual paper"), a thermal transfer apparatus is used. This step is thoroughly the same as First Proof™. When the image-receiving sheet and a transferee are superposed and applied with heat and pressure, these two members are bonded and then the image-receiving sheet is separated from the transferee, as a result, only the image and the image-receiving layer remain on the transferee and the image-receiving sheet support and the cushion layer are removed. Accordingly, in practice, the image is transferred to the transferee from the image-receiving sheet.

In First Proof™, the image is transferred by superposing an actual paper sheet and the image-receiving sheet on an aluminum-made guide plate and passing these through heat rollers. The aluminum guide plate is used for the purpose of preventing the deformation of actual paper. However, when this is employed for the present system of B2 size, an aluminum guide plate larger than B2 is necessary and this causes a problem that the space for installing the apparatus becomes large. Therefore, in the present system, instead of using an aluminum guide plate, a structure that the transferee with the image-receiving sheet is discharged to the insertion side by the 180° rotation of a conveyance path was employed, as a result, the installation space became very compact (FIG. 2). However, since an aluminum guide plate is not used, there arises a problem that the actual paper is deformed. More specifically, a pair of actual paper and image-receiving sheet discharged is curled by allowing the image-receiving sheet to face inside and rolled on the discharge table. The work of separating the image-receiving sheet from the curled-up actual paper is very difficult.

The methods for preventing the curling up are studied, that is, a bimetal effect utilizing the difference in the shrinkage amount between the actual paper and the image-receiving sheet, and an iron effect by virtue of a structure of winding the paired sheets around a heat roller. In the case of inserting the image-receiving sheet by superposing it on an actual paper sheet as in conventional techniques, the heat shrinkage of image-receiving sheet with respect to the insertion and delivery direction is larger than the heat shrinkage of actual paper and therefore, in the curling by the bimetal effect, the upper side works out to the inner side and this is the same as the direction in the iron effect, as a result, curling becomes severer due to synergistic effect. However, when the image-receiving sheet is inserted to come to the lower side of actual paper, the curling is cancelled and the problem is solved. Incidentally, when the transferee is a material analogous to the image-receiving sheet such as plastic film, this apparatus may be used, but the curling problem is not serious as compared with the actual paper and therefore, commonly employed heat rollers can also be used.

The sequence of transferring the image on a transferee (hereinafter referred to as a "transferee transfer method for use in this system") is described below.

1) First, the heat roller 43 temperature (from 100 to 110° C.) and the transportation speed at transfer are set by a dial (not shown) according to the kind of transferee 42.

2) Next, the image-receiving sheet 20 is placed on the insertion table by laying the image to face the upside and dusts on the image are removed by a destaticizing brush (not shown). On the image-receiving sheet, a transferee 42 from which dusts are removed is superposed. At this time, the size of the transferee 42 is larger than the size of the underlying image-receiving sheet 20 and therefore, the position of the image-receiving sheet 20 is unviewed to make difficult the positioning. In order to improve the workability, marks 45 showing positions where the image-receiving sheet and the transferee are placed, respectively, are put on the insertion table 44. The size of the transferee is larger, whereby the image-receiving sheet 20 can be prevented from slipping and protruding from the transferee to stain the heat rollers 43 by the image-receiving layer of the image-receiving sheet 20.

3) When the image-receiving sheet and transferee in the superposed state are pressed into the insertion port, the insertion rollers 46 rotate to deliver these two members toward the heat rollers 43.

4) When reached the position of heat roller 43, the leading end of the transferee is nipped by the heat rollers and the transfer is started. The heat roller is a heat-resistant silicon rubber roller. Due to pressure and heat applied at the same time here, the image-receiving sheet and the transferee are bonded. In the downstream of heat rollers, a guide 47 formed of a heat-resistant sheet is provided. The pair of image-receiving sheet and transferee while in the heated state is transported to the upper side between the upper heat roller and the guide 47, separated from the heat roller at the position of separation claw 48, and guided to the discharge port 50 along the guide plate 49.

5) The pair of image-receiving sheet and transferee come out from the discharge port 50 is discharged on the insertion table while in the bonded state. Thereafter, the image-receiving sheet 20 is manually separated from the transferee 42.

Feature 2 of the systematization technique is the constitution of system.

These apparatuses are connected on a plate-making system, whereby the function as a color proof can be exerted. The system is required to output from the proof a printed matter having an image quality infinitely close to a printed matter output based on certain plate-making data. To satisfy this requirement, a software for approximating the colors and halftone dots to those of a printed matter is necessary. A specific example of the connection is described below.

In the case of obtaining a proof of printed matter from a plate-making system named Celebra™ manufactured by Fuji Photo Film Co., Ltd., the system connection is performed as follows. A CTP (computer to plate) system is connected to Celebra and a printing plate output from the system is used for printing by a press, whereby a final printed matter is obtained. Luxel FINALPROOF 5600 (hereinafter sometimes referred to as FINALPROOF) manufactured by Fuji Photo Film Co., Ltd., which is the above-described recording apparatus, is connected as the color proof to Celebra and between them, PD Systems™ produced by Fuji Photo Film Co., Ltd. is connected as a proof drive software for approximating the colors and halftone dots to a printed matter.

Figure 4:
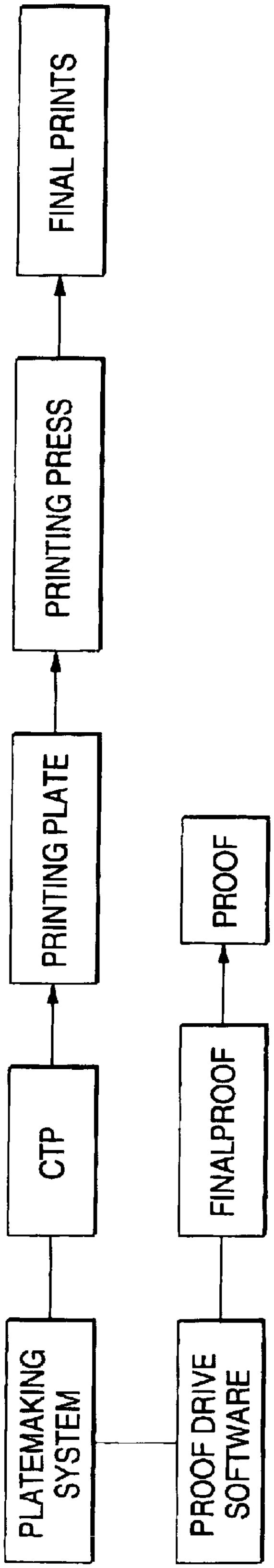
FIG. 4 A view showing a constitution example of the system using FINALPROOF as the recording apparatus for laser thermal transfer.

The con-tone (continuous tone) data converted into raster data in Celebra are converted into binary data for halftone dots, output to the CTP system and finally printed. On the other hand, the same contone data are output also to the PD System. The PD System converts the received data by using a table of at least four colors to agree the colors with those of a printed matter and finally converts the data into binary data for halftone dots to agree the halftone dots with those of a printed matter. These data are output to FINALPROOF (FIG. 4).

The table of at least four colors is previously prepared by performing an experiment and stored in the system. The experiment for preparation of the table is performed as follows. After preparing an image printed through a CTP system from important color data and an image output to FINALPROOF through the PD System, the measured color values are compared and a table is prepared such that the difference in the measured color values is minimized.

As described above, in the present invention, a system constitution capable of sufficiently exerting the capacitance of a material having high resolution is realized.

The thermal transfer sheet which is a material for use in the system of the present invention is described below.

The absolute value of the difference between the surface roughness Rz on the image-forming layer surface of the thermal transfer sheet and the surface roughness Rz on the surface of the backside layer thereof is preferably 3.0 μm or less, and the absolute value of the difference between the surface roughness Rz on the image-receiving layer surface of the image-receiving sheet and the surface roughness Rz on the surface of the backside layer thereof is preferably 3.0 μm or less. By having such a constitution in combination with the above-described cleaning technique, the generation of image defects and the jamming of sheets on transportation can be prevented and the dot gain stability can be enhanced.

The surface roughness Rz as used in the present invention means a ten point average surface roughness corresponding to Rz (maximum height) defined by JIS and this is determined as follows. A basic area portion is extracted from the roughness curved surface and using an average face in this portion as the basic face, the distance between the average altitude of peaks from the highest to the fifth height and the average depth of troughs from the deepest to the fifth depth is input and converted. For the measurement, a probe-system three-dimensional roughness meter (Surfcom 570A-3DF) manufactured by Tokyo Seimitsu Co., Ltd. is used. The measured direction is longitudinal direction, the cut-off value is 0.08 mm, the measured area is 0.6 mm×0.4 mm, the feed pitch is 0.005 mm and the measurement speed is 0.12 mm/s.

From the standpoint of more enhancing the above-described effects, the absolute value of difference between the surface roughness Rz on the image-forming layer surface of the thermal transfer sheet and the surface roughness Rz on the surface of the backside layer thereof is preferably 1.0 μm or less and the absolute value of difference between the surface roughness Rz on the image-receiving layer surface of the image-receiving sheet and the surface roughness Rz on the surface of the backside layer thereof is preferably 1.0 μm or less.

In another embodiment, the image-forming layer surface of the thermal transfer sheet and the surface of the backside layer thereof and/or the front and back surfaces of the image-receiving sheet preferably have a surface roughness Rz of 2 to 30 μm. By having such a constitution in combination with the above-described cleaning technique, the generation of image defects and the jamming of sheets on transportation can be prevented and the dot gain stability can be enhanced.

The glossiness on the image-forming layer of the thermal transfer sheet is preferably from 80 to 99 (except for W color).

The glossiness greatly depends on the smoothness on the surface of the image-forming layer and affects the uniformity in the layer thickness of the image-forming layer. With higher glossiness, the image-forming layer can be more uniform and more suitable for uses of forming a high-definition image, but if the smoothness is higher, the resistance at the transportation becomes larger. Thus, the smoothness and the resistance are in the trade-off relationship, but these can be balanced and both attained when the glossiness is from 80 to 99 (except for W color).

The mechanism of forming a multicolor image by the thin-film thermal transfer using a laser is roughly described below by referring to FIG. 1.

On the surface of an image-forming layer 16 containing a pigment of black (K), cyan (C), magenta (M), yellow (Y) or the like of a thermal transfer sheet 10, an image-receiving sheet 20 is stacked to prepare an image-forming laminate 30. The thermal transfer sheet 10 comprises a support 12 having thereon a light-to-heat conversion layer 14 and further thereon an image-forming layer 16, and the image-receiving sheet 20 comprises a support 22 having thereon an image-receiving layer 24 and is stacked on the thermal transfer sheet 10 to bring the image-receiving layer 24 into contact with the surface of the image-forming layer 16 (see, FIG. 1-*a*). When laser light is imagewise irradiated in time series on the obtained laminate 30 from the support 12 side of the thermal transfer sheet 10, the light-to-heat conversion layer 14 of the thermal transfer sheet 10 in the region irradiated with the laser light generates heat and decreases in the adhesive strength with the image-forming layer 16 (see, FIG. 1-*b*) Thereafter, the image-receiving sheet 20 and the thermal transfer sheet 10 are separated, then, the image-forming layer 16 in the region 16' irradiated with the laser light is transferred onto the image-receiving layer 24 of the image-receiving sheet 20 (see FIG. 1-*c*).

In the multicolor image formation, the laser light used for the light irradiation is preferably multibeam laser light, more preferably light of multibeam two-dimensional arrangement. The multibeam two-dimensional arrangement means that on performing the recording by laser irradiation, a plurality of laser beams are used and the spot arrangement of these laser beams forms a two-dimensional plane arrangement comprising a plurality of rows along the main scanning direction and a plurality of lines along the sub-scanning direction.

By using the laser light of multibeam two-dimensional arrangement, the time period necessary for the laser recording can be shortened.

The laser light can be used without particular limitation. For example, a gas laser light such as argon ion laser light, helium-neon laser light and helium-cadmium laser light, a solid-state laser light such as YAG laser light, or a direct laser light such as semiconductor laser light, dye laser light and excimer laser light, is used. In addition, for example, light converted into a half wavelength by passing the above-described laser light through a secondary higher harmonic device may also be used. In the multicolor image forming method, semiconductor laser light is preferably used on considering the output power and the easiness of modulation. In the multicolor image forming method, the laser light is preferably irradiated under the conditions of giving a beam diameter of 5 to 50 μm (particularly from 6 to 30 μm) on the light-to-heat conversion layer. The scanning speed is preferably 1 m/sec or more (particularly 3 m/sec or more).

In the multicolor image formation, the thickness of the image-forming layer in the black thermal transfer sheet is preferably larger than that of the image-forming layer in each thermal transfer sheet for yellow, magenta, cyan or the like and is preferably from 0.5 to 0.7 μm. By constituting in this way, the reduction in density due to transfer unevenness can be suppressed at the irradiation of laser on the black thermal transfer sheet.

By setting the layer thickness of the image-forming layer in the black thermal transfer sheet to 0.5 μm or more, the image density can be maintained without causing transfer unevenness on recording with high energy and an image density necessary as a proof for printing can be achieved. This tendency is stronger under high humidity conditions and the density can be prevented from changing due to environment. On the other hand, by setting the layer thickness to 0.7 μm or less, the transfer sensitivity can be maintained at the laser recording and fixing of small points or reproduction of fine lines are improved. This tendency is stronger under low humidity conditions. Also, the resolution can be enhanced. The layer thickness of the image-forming layer in the black thermal transfer sheet is more preferably from 0.55 to 0.65 μm, still more preferably 0.60 μm.

Furthermore, it is preferred that the layer thickness of the image-forming layer in the black thermal transfer sheet is from 0.5 to 0.7 μm and the layer thickness of the image-forming layer in each thermal transfer sheet for yellow, magenta, cyan or the like is from 0.2 μm to less than 0.5 μm.

By setting the layer thickness of the image-forming layer in each thermal transfer sheet for yellow, magenta, cyan or the like to 0.2 μm or more, the density can be maintained without causing transfer unevenness at the laser recording, and by setting the layer thickness to less than 0.5 μm, the transfer sensitivity and resolution can be enhanced. The layer thickness is more preferably from 0.3 to 0.45 μm.

The image-forming layer in the black thermal transfer sheet preferably contains carbon black. The carbon black preferably comprises at least two kinds of carbon blacks differing in the staining power, because the reflection density can be adjusted while keeping constant the P/B (pigment/binder) ratio.

The staining power of carbon black is expressed by various methods and, for example, PVC blackness described in JP-A-10-140033 may be used. The PVC blackness is determined as follows. Carbon black is added to PVC resin, dispersed by means of a twin roller and formed into a sheet and by setting the base values that the blackness of Carbon Black "#40" and "#45" produced by Mitsubishi Chemical is Point 1 and Point 10, respectively, the blackness of the sample is evaluated by the judgement with an eye. Two or more carbon blacks differing in the PVC blackness can be appropriately selected and used according to the purpose.

The method for preparing a sample is specifically described below.

<Production Method of Sample>

In a 250 ml-volume Banbury mixer, 40 mass % of a sample carbon black is blended with LDPE (low-density polyethylene) resin and kneaded at 115° C. for 4 minutes.

Blending Conditions:

| | |
|---|---|
| LDPE resin | 101.89 g |
| Calcium stearate | 1.39 g |
| Irganox 1010 | 0.87 g |
| Sample carbon black | 69.43 g |

Then, the kneaded material is diluted at 120° C. using a twin roller mill to a carbon black concentration of 1 mass %.

Conditions in Production of Diluted Compound:

| | |
|---|---|
| LDPE resin | 58.3 g |
| Calcium stearate | 0.2 g |
| Resin having blended therein 40 mass % of carbon black | 1.5 g |

The diluted compound is processed into a sheet form through a 0.3 mm-width slit and the obtained sheet is cut into chips and formed into a film of 65±3 μm on a hot plate at 240° C.

In forming a multicolor image, the multicolor image may be formed by a method of using, as described above, thermal transfer sheets and repeatedly superposing many image layers (image-forming layers having formed thereon an image) on the same image-receiving sheet or by a method of once forming an image on each image-receiving layer of a plurality of image-receiving sheets and re-transferring the images to actual printing paper or the like.

In the latter method, for example, thermal transfer sheets differing in the color hue of the coloring material contained in the image-forming layer are prepared and five kinds (four example, cyan, magenta, yellow, black and red) of laminates for image formation are independently produced by combining the thermal transfer sheet with an image-receiving sheet. On each laminate, for example, laser light is irradiated through a color separation filter according to digital signals based on an image and subsequently, the thermal transfer sheet and the image-receiving sheet are separated to independently form a color separation image of each color on each image-receiving sheet. Respective color separation images formed are sequentially stacked on a separately prepared actual support such as actual printing paper or on a support approximated thereto, whereby a multicolor image can be formed.

The thermal transfer sheet used with laser light irradiation is preferably used for forming an image on an image-receiving sheet by a thin-film transfer system where a laser beam is converted into heat and an image-forming layer containing a pigment is transferred to an image-receiving sheet by making use of heat energy. These techniques used for the development of an image forming material comprising a thermal transfer sheet and an image-receiving sheet can be appropriately applied to the development of a thermal transfer sheet and/or an image-receiving sheet in a fusion-type transfer system, a transfer system by ablation, and a sublimation-type transfer system. The system of the present invention can also include the image forming material used for these systems.

The thermal transfer sheet and the image-receiving sheet are described in detail below.

[Thermal Transfer Sheet]

The thermal transfer sheet has at least a light-to-heat conversion layer and an image-forming layer on a support and if desired, additionally has other layers.

(Support)

The material for the support of the thermal transfer sheet is not particularly limited and various support materials can be used according to the purpose. The support preferably has rigidity, good dimensional stability and durability against heat at the image formation. Preferred examples of the support material include synthetic resin materials such as polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymer, (aromatic or aliphatic) polyamide, polyimide, polyamideimide and polysulfone. Among these, biaxially stretched polyethylene terephthalate is preferred in view of the mechanical strength and dimensional stability against heat. In the case of use for the manufacture of a color proof utilizing laser recording, the support of the thermal transfer sheet is preferably formed of a transparent synthetic resin material capable of transmitting laser light. The thickness of the support is preferably from 25 to 130 μm, more preferably from 50 to 120 μm. The center line average surface roughness Ra (measured according to JIS B0601 by using a surface roughness meter (Surfcom, manufactured by Tokyo Seimitsu Co., Ltd.)) of the support in the image-forming layer side is preferably less than 0.1 μm. The Young's modulus in the longitudinal direction of the support is preferably from 200 to 1,200 $kg/mm^2$ (about 2 to 12 GPa) and the Young's modulus in the cross direction is preferably from 250 to 1,600 $kg/mm^2$ (about 2.5 to 16 GPa). The F-5 value in the longitudinal direction of the support is preferably from 5 to 50 $kg/mm^2$ (about 49 to 490 MPa) and the F-5 value in the cross direction of the support is preferably from 3 to 30 $kg/mm^2$ (about 29.4 to 294 MPa). The F-5 value in the longitudinal direction of the support is generally higher than the F-5 value in the cross direction of the support but this does not apply when the strength particularly in the cross direction must be high. The heat shrinkage percentage at 100° C. for 30 minutes in the longitudinal and cross directions of the support is preferably 3% or less, more preferably 1.5% or less, and the heat shrinkage percentage at 80° C. for 30 minutes is preferably 1% or less, more preferably 0.5% or less. The rupture strength is preferably from 5 to 100 $kg/mm^2$ (about 49 to 980 MPa) in both directions and the elastic modulus is preferably from 100 to 2,000 $kg/mm^2$ (about 0.98 to 19.6 GPa).

The support of the thermal transfer sheet may be subjected to a surface activation treatment and/or a treatment of providing one or more undercoat layer so as to improve the adhesive property to the light-to-heat conversion layer provided on the support. Examples of the surface activation treatment include a glow discharge treatment and a corona discharge treatment. The material for the undercoat layer preferably has high adhesive property to both surfaces of the support and the light-to-heat conversion layer and also has small heat conductivity and excellent heat resistance. Examples of such a material for the undercoat layer include styrene, styrene-butadiene copolymers and gelatin. The thickness of the entire undercoat layer is usually from 0.01 to 2 μm. If desired, the surface of the thermal transfer sheet in the side opposite the side where the light-to-heat conversion layer is provided may be subjected to a treatment of providing various functional layers such as antireflection layer and antistatic layer, or to a surface treatment.

(Back Layer)

A back layer is preferably provided on the surface of the thermal transfer sheet of the present invention in the side opposite the side where the light-to-heat conversion layer is provided. The back layer is preferably constituted by two layers, namely, a first back layer adjacent to the support and a second back layer provided on the first back layer in the side opposite the support. In the present invention, the ratio B/A of the mass A of the antistatic agent contained in the first back layer to the mass B of the antistatic agent contained in the second back layer is preferably less than 0.3. If the B/A ratio is 0.3 or more, the slipping property and the powder falling from the back layer are liable to change for the worse.

The layer thickness C of the first back layer is preferably from 0.01 to 1 μm, more preferably from 0.01 to 0.2 μm. The layer thickness D of the second back layer is preferably from 0.01 to 1 μm, more preferably from 0.01 to 0.2 μm. The ratio C:D in the layer thickness between these first and second back layers is preferably from 1:2 to 5:1.

Examples of the antistatic agent which can be used in the first and second back layers include nonionic surfactants such as polyoxyethylene alkylamine and glycerol fatty acid ester, cationic surfactants such as quaternary ammonium salt, anionic surfactants such as alkyl phosphate, amphoteric surfactants, and compounds such as electrically conducting resin.

An electrically conducting fine particle can also be used as the antistatic agent. Examples of the electrically conducting fine particle include oxides such as ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$ and $MgB_2O_5$; sulfides such as CuS and ZnS; carbides such as SiC, TiC, ZrC, VC, NbC, MoC and WC; nitrides such as $Si_3N_4$, TiN, ZrN, VN, NbN and $Cr_2N$; borides such as $TiB_2$, $ZrB_2$, $NbB_2$, $Ta_2$, CrB, MoB, WB and $LaB_5$; silcides such as $TiSi_2$, $ZrSi_2$, $NbSi_2$, $TaSi_2$, $CrSi_2$, $MoSi_2$ and $WSi_2$; metal salts such as $BaCO_3$, $CaCO_3$, $SrCO_3$, $BaSO_4$ and $CaSO_4$; and composite materials such as $SiN_4$—SiC and $9Al_2O_3$-$2B_2O_3$. These particles may be used individually or in combination of two or more thereof. Among these, $SnO_2$, ZnO, $Al_2O_3$, $TiO_2$, $In_2O_3$, MgO, BaO and $MoO_3$ are preferred, $SnO_2$, ZnO, $In_2O_3$ and $TiO_2$ are more preferred, and $SnO_2$ is still more preferred.

In the case of using the thermal transfer material of the present invention for the laser thermal transfer system, the antistatic agent used in the back layer is preferably substantially transparent so that the laser light can be transmitted.

In the case of using an electrically conducting metal oxide as the antistatic agent, the particle size thereof is preferably smaller so as to reduce the light scattering as much as possible, but the particle size must be determined by using, as a parameter, the ratio in the refractive index between the particle and the binder and can be obtained by using the Mie Scattering Theory. The average particle size is generally from 0.001 to 0.5 μm, preferably from 0.003 to 0.2 μm. The average particle size as used herein is a value including not only a primary particle size of the electrically conducting metal oxide but also a particle size of higher structures.

In addition to the antistatic agent, various additives such as surfactant, slipping agent and matting agent, and a binder may be added to the first and second back layers. The amount of the antistatic agent contained in the first back layer is preferably from 10 to 1,000 parts by mass, more preferably from 200 to 800 parts by mass, per 100 parts by mass of the binder. The amount of the antistatic agent contained in the second back layer is preferably from 0 to 300 parts by mass, more preferably from 0 to 100 parts by mass, per 100 parts by mass of the binder.

Examples of the binder which can be used in the formation of first and second back layers include homopolymers and copolymers of acrylic acid-based monomers such as acrylic acid, methacrylic acid, acrylic acid ester and methacrylic acid ester; cellulose-base polymers such as nitrocellulose, methyl cellulose, ethyl cellulose and cellulose acetate; vinyl-base polymers and copolymers of vinyl compounds, such as polyethylene, polypropylene, polystyrene, vinyl chloride copolymer, vinyl chloride-vinyl acetate copolymer, polyvinylpyrrolidone, polyvinyl butyral and polyvinyl alcohol; condensed polymers such as polyester, polyurethane and polyamide; rubber-base thermoplastic polymers such as butadiene-styrene copolymer; polymers obtained by polymerizing or crosslinking a photopolymerizable or thermopolymerizable compound such as epoxy compound; and melamine compounds.

(Light-To-Heat Conversion Layer)

The light-to-heat conversion layer contains a light-to-heat converting substance, a binder and if desired, a matting agent. Furthermore, if desired, the light-to-heat conversion layer contains other components.

The light-to-heat converting substance is a substance having a function of converting energy of the irradiated light into heat energy. This substance is generally a dye (including a pigment, hereinafter the same) capable of absorbing laser light. In the case of recording an image by using an infrared laser, an infrared absorbing dye is preferably used as the light-to-heat converting substance. Examples of the dye include black pigments such as carbon black; pigments formed of a macrocyclic compound having absorption in the region from visible to near infrared, such as phthalocyanine and naphthalocyanine; organic dyes used as a laser-absorbing material in the high-density laser recording such as optical disk (for example, cyanine dyes such as indolenine dye, anthraquinone-base dyes, azulene-base dyes and phthalocyanine-base dyes); and organometallic compound dyes such as dithiol-nickel complex. Among these, cyanine-base dyes are preferred because this dye exhibits a high absorption coefficient to light in the infrared region and when used as a light-to-heat converting substance, the thickness of the light-to-heat conversion layer can be reduced, as a result, the recording sensitivity of the thermal transfer sheet can be more enhanced.

Other than the dye, particulate metal materials such as blacked silver, and inorganic materials may also be used as the light-to-heat converting substance.

The binder contained in the light-to-heat conversion layer is preferably a resin having at least a strength sufficiently large to form a layer on a support and having a high heat conductivity. A resin having heat resistance and incapable of decomposing even by the heat generated from the light-to-heat converting substance on image recording is more preferred, because even when light irradiation with high energy is performed, the smoothness on the surface of the light-to-heat conversion layer can be maintained after the light irradiation. More specifically, a resin having a thermal decomposition temperature (a temperature of giving a mass decrement of 5% in an air stream at a temperature-rising rate of 10° C./min according to the TGA method (thermogravimetric analysis)) of 400° C. or more is preferred and a resin having a thermal decomposition temperature of 500° C. or more is more preferred. Also, the binder preferably has a glass transition temperature of 200 to 400° C., more preferably from 250 to 350° C. If the glass transition temperature is less than 200° C., fogging may be generated on the formed image, whereas if it exceeds 400° C., the solubility of the resin decreases and the production efficiency is sometimes lowered.

The heat resistance (for example, thermal deformation temperature or thermal decomposition temperature) of the binder in the light-to-heat conversion layer is preferably higher as compared with the materials used in other layers provided on the light-to-heat conversion layer.

Specific examples of the binder include acrylic acid-base resin (e.g., polymethyl methacrylate), polycarbonate, polystyrene, vinyl-base resin (e.g., vinyl chloride/vinyl acetate copolymer, polyvinyl alcohol), polyvinyl butyral, polyester, polyvinyl chloride, polyamide, polyimide, polyamideimide, polyether imide, polysulfone, polyether sulfone, aramid, polyurethane, epoxy resin and urea/melamine resin. These are used individually or in combination of two or more. Among these, polyamideimide resin and polyimide resin are preferred.

The polyamideimide resin is preferably a polyamideimide represented by the following formula (A):

(A)

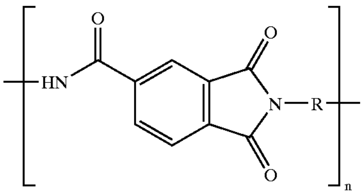

wherein R represents a divalent linking group. Specific preferred examples of the divalent linking group are set forth below.

(1)

$-(CH_2)_n-$ (n = 1~10)

(2)

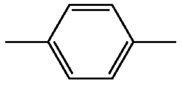

(3)

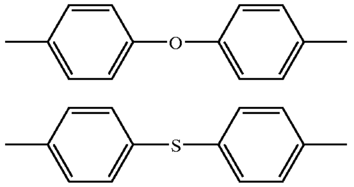

(4)

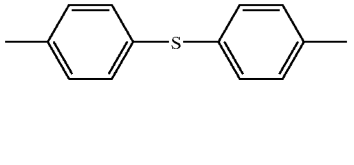

-continued
(5)
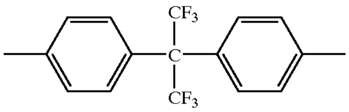
(6)
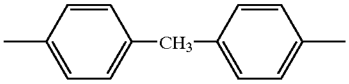
(7)
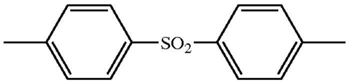
(8)
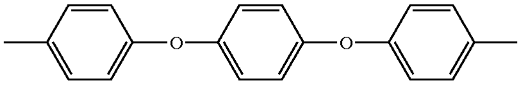
(9)
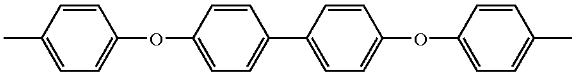
(10)
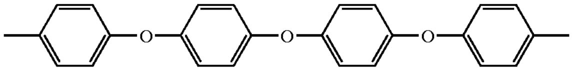
(11)
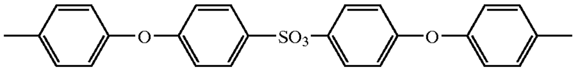
(12)
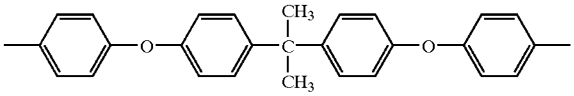
(13)
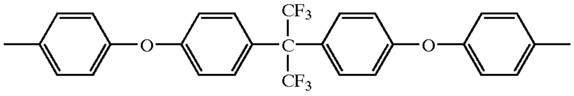
(14)
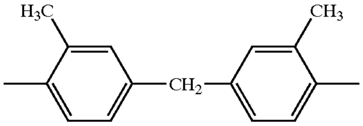
(15)
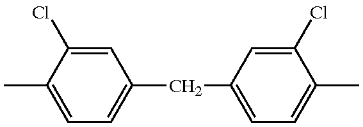
(16)
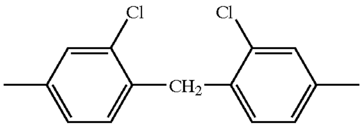
(17)
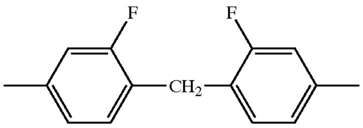
-continued
(18)
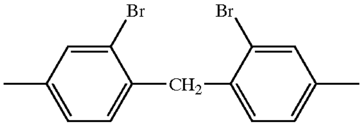
(19)
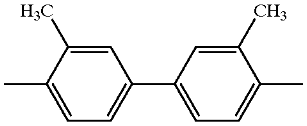
(20)
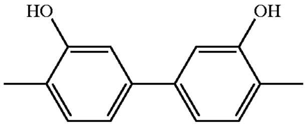
(21)
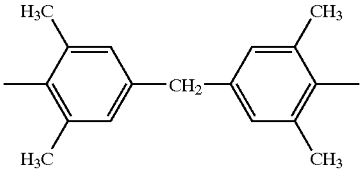
(22)
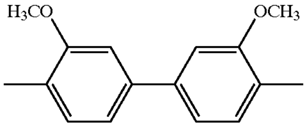
(23)
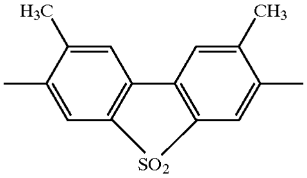
The polyimide resin is particularly represented by any one of the following formulae (I) to (VIII):
(I)
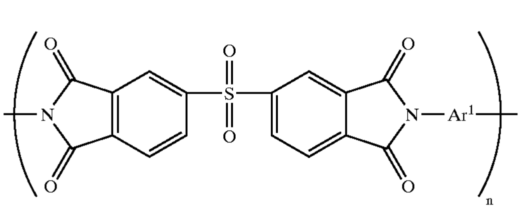
(II)
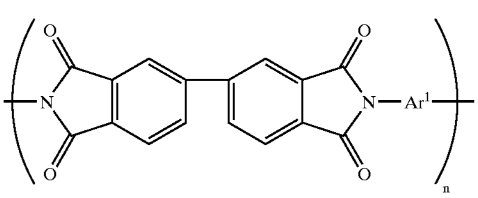

wherein $Ar^1$ represents an aromatic group represented by the following structural formula (1), (2) or (3), and n represents an integer of 10 to 100:
(1)
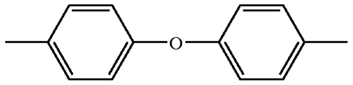
(2)
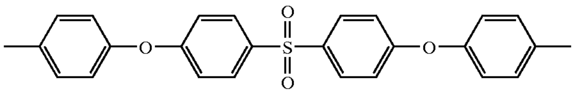
(3)
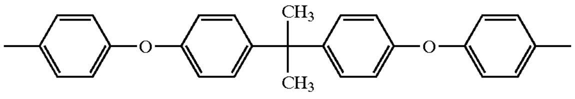
-continued
(III)
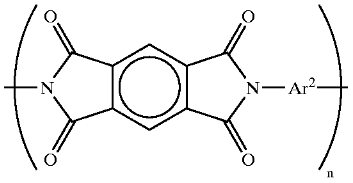
(IV)
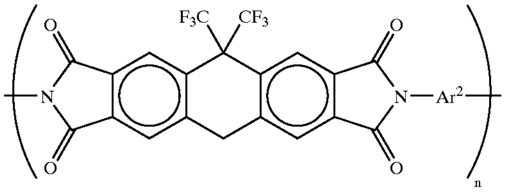
wherein in formulae (III) and (IV), $Ar^2$ represents an aromatic group represented by the following formula (4), (5), (6) or (7), and n represents an integer of 10 to 100:
(4)
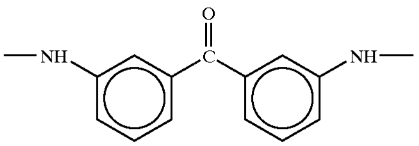
(5)
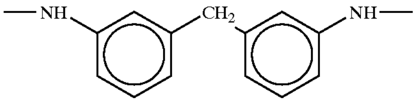
(6)
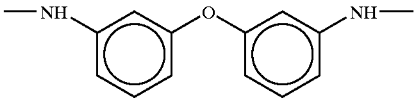
(7)
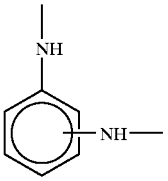
(V)
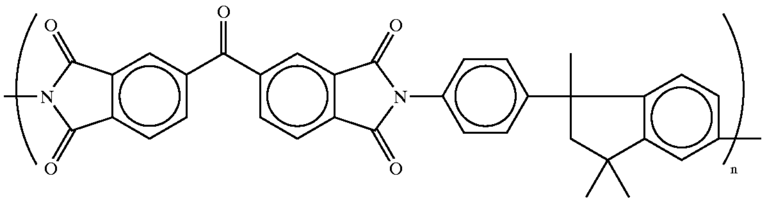
(VI)
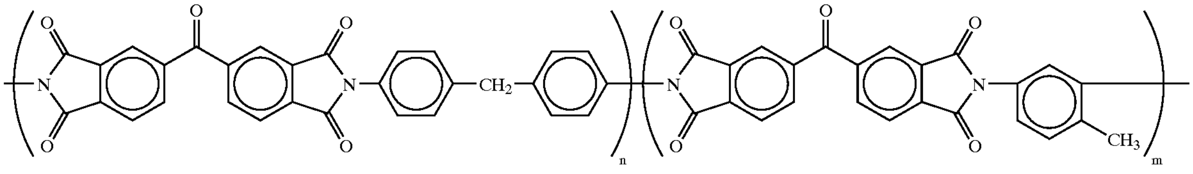
(VII)
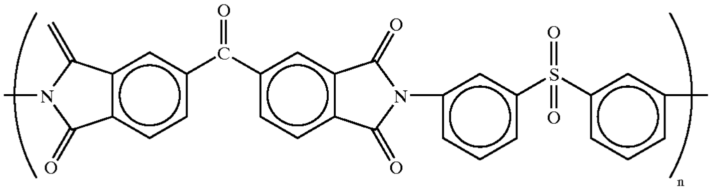

wherein in formulae (V) to (VII), n and m each represents an integer of 10 to 100, and in formula (VI), the ratio n:m is from 6:4 to 9:1.

As for the standard for the judgement whether the resin is soluble in an organic solvent, on the basis that 10 parts by mass or more of resin dissolves per 100 parts by mass of N-methylpyrrolidone at 25° C., when 10 parts by mass or more of resin is dissolved, the resin is preferably used as the resin for the light-to-heat conversion layer. When 100 parts by mass of resin is dissolved per 100 parts by mass of N-methylpyrrolidone, this resin is more preferred.

The resin (e.g., polyamideimide) contained as a binder in the light-to-heat conversion layer preferably has an SP (solubility parameter) value of 25 or more as calculate by the Okitsu's equation. By setting the SP value of the resin contained in the light-to-heat conversion layer to 25 or more, the amount of the light-to-heat converting substance such as infrared absorbing dye or a decomposition product thereof, migrated into the image-forming layer is reduced.

The Okitsu's equation is described in detail in *Nippon Secchaku Gakkai Shi*(*Journal of Japan Adhesive Society*), Vol. 29, No. 5 (1993).

An infrared absorbing dye represented by the following formula (B) is very preferred as the light-to-heat converting substance, because this dye has excellent heat resistance, undergoes no decomposition even after aging of the coating solution and causes no reduction in the absorbance. This is particularly effective when combined with the above-described polyamideimide resin.

Formula (B):

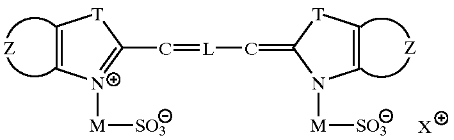

In this formula, examples of the ring completed by Z include a benzene ring, a naphthalene ring, a pyridine ring, a quinoline ring, a pyrazine ring and a quinoxaline ring. Also, another substituent $R^6$ may be further bonded on Z. Examples of the substituent $R^6$ include various substituents such as alkyl group, aryl group, heterocyclic residue, halogen atom, alkoxy group, aryloxy group, alkylthio group, arylthio group, alkylcarbonyl group, arylcarbonyl group, alkyloxycarbonyl group, aryloxycarbonyl group, alkylcarbonyloxy group, arylcarbonyloxy group, alkylamide group, arylamide group, alkylcarbamoyl group, arylcarbamoyl group, alkylamino group, arylamino group, carboxylic acid group, alkylsulfonyl group, arylsulfonyl group, alkylsulfonamide group, arylsulfonamide group, alkylsulfamoyl group, arylsulfamoyl group, cyano group and nitro group. Usually, the number (p) of substituents bonded on Z is preferably 0 or approximately from 1 to 4. When p is 2 or more, multiple $R^6$s may be the same or different.

Among the substituents represented by $R^6$, preferred are a halogen atom (e.g., F, Cl), a cyano group, a substituted or unsubstituted alkoxy group having from 1 to 20 carbon atoms (e.g., methoxy, ethoxy, dodecyloxy, methoxyethoxy), a substituted or unsubstituted phenoxy group having from 6 to 20 carbon atoms (e.g., phenoxy, 3,5-dichlorophenoxy, 2,4-di-tert-pentylphenoxy), a substituted or unsubstituted alkyl group having from 1 to 20 carbon atoms (e.g., methyl, ethyl, isobutyl, tert-pentyl, octadecyl, cyclohexyl) and a substituted or unsubstituted phenyl group having from 6 to 20 carbon atoms (e.g., phenyl, 4-methylphenyl, 4-trifluoromethylphenyl, 3,5-dichloro-phenyl).

In formula (B), T represents —O—, —S—, —Se—, —N($R^1$)—, —C($R^2$)($R^3$)— or —C($R^4$)═C($R^5$)—. The group represented by $R^1$, $R^2$, $R^3$, $R^4$ and $R^5$ is preferably a substituted or unsubstituted alkyl, aryl or alkenyl group, more preferably an alkyl group. The number of carbon atoms in the group represented by $R^1$ to $R^5$ is preferably from 1 to 30, more preferably from 1 to 20.

In the case where the group represented by $R^1$ to $R^5$ further has a substituent, preferred examples of the substituent include a sulfonic acid group, an alkyl-carbonyloxy group, an alkylamide group, an alkylsulfonamide group, an alkoxycarbonyl group, an alkylamino group, an alkylcarbamoyl group, an alkylsulfamoyl group, an alkoxy group, an aryloxy group, an alkylthio group, an arylthio group, an alkyl group, an aryl group, a carboxyl group, a halogen atom and a cyano group.

Among these substituents, more preferred are a halogen atom (e.g., F, Cl), a cyano group, a substituted or unsubstituted alkoxy group having from 1 to 20 carbon atoms (e.g., methoxy, ethoxy, dodecyloxy, methoxyethoxy), a substituted or unsubstituted phenoxy group having from 6 to 20 carbon atoms (e.g., phenoxy, 3,5-dichlorophenoxy, 2,4-di-tert-pentylphenoxy), a substituted or unsubstituted alkyl group having from 1 to 20 carbon atoms (e.g., methyl, ethyl, isobutyl, tert-pentyl, octadecyl, cyclohexyl) and a substituted or unsubstituted phenyl group having from 6 to 20 carbon atoms (e.g., phenyl, 4-methylphenyl, 4-trifluoromethylphenyl, 3,5-dichlorophenyl). $R^1$ to $R^5$ each is most preferably an unsubstituted alkyl group having from 1 to 8 carbon atoms. T is preferably —C($CH_3$)$_2$—.

In formula (B), L represents a trivalent linking group resulting from linking of five or seven methine groups by a conjugated double bond and may be substituted. That is, L represents a pentamethine or heptamethine group resulting from linking of methine groups by a conjugated double bond, but specifically, the groups represented by the following formulae (L-1) to (L-6) are preferred.

(L-1)

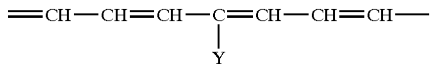

(L-2)

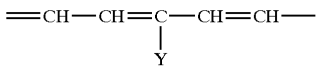

(L-3)

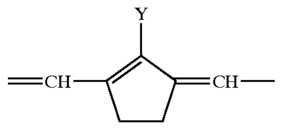

(L-4)

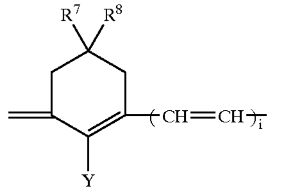

(L-5)

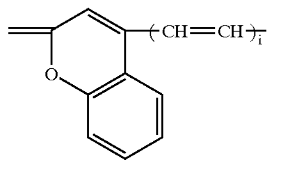

-continued (L-6)

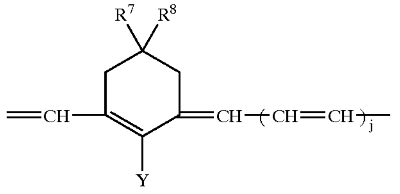

Among these specific examples, linking groups of forming a tricarbocyanine, represented by formulae (L-2), (L-3), (L-4), (L-5) and (L-6), are preferred. In formulae (L-1) to (L-6), Y represents a hydrogen atom or a monovalent group. The monovalent group represented by Y is preferably a lower alkyl group (e.g., methyl), a lower alkoxy group (e.g., methoxy), a substituted amino group (e.g., dimethylamino, diphenylamino, methylphenylamino, morpholino, imidazolidine, ethdxycarbonylpiperazine), an alkylcarbonyloxy group (e.g., acetoxy), an alkylthio group (e.g., methylthio), a cyano group, a nitro group or a halogen atom (e.g., Br, Cl, F).

Y is preferably a hydrogen atom, and $R_7$ and $R_8$ each is preferably a hydrogen atom or a lower alkyl group (e.g., methyl). In formulae (L-4) to (L-6), i is 1 or 2 and j is 0 or 1. M represents a dialent linking group, preferably a substituted or unsubstituted alkylene group having from 1 to 20 carbon atoms, such as ethylene group, propylene group and butylene group.

In formula (B), $X^+$ represents a cation and examples thereof include metal ions (e.g., $Na^+$, $K^+$), ammonium ions (for example, ion represented by $HN^+(C_2H_5)_3$) and pyridinium ion.

Specific examples of the compound represented by formula (B) are set forth below, but the present invention is not limited thereto.

(I-1)

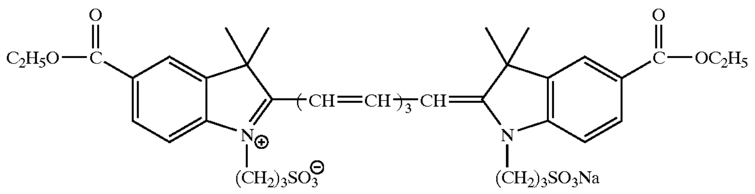

(I-2)

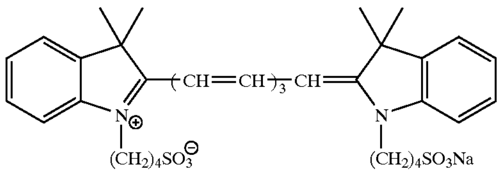

(I-3)

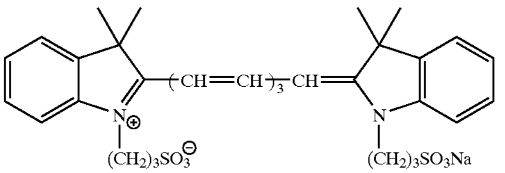

(I-4)

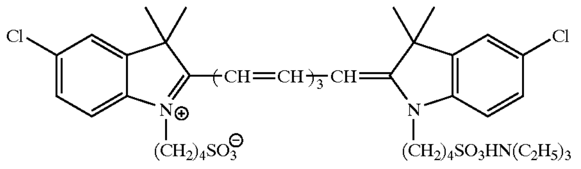

(I-5)

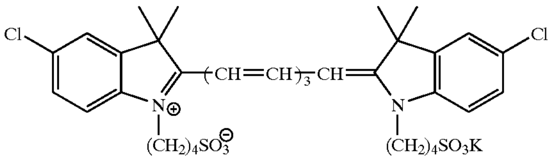

(I-6)

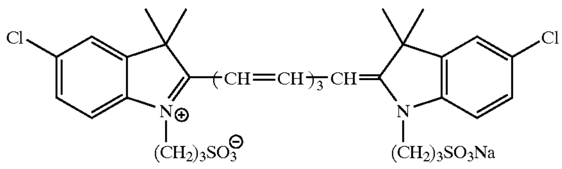

(I-7)

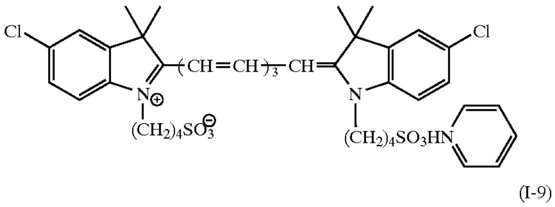

(I-8)

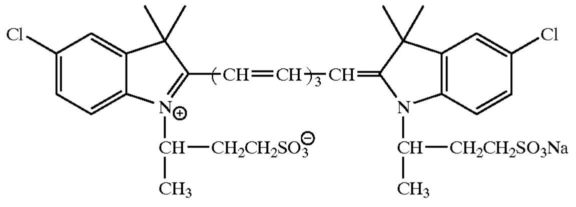

(I-9)

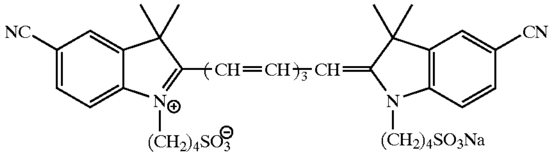

-continued (I-10)

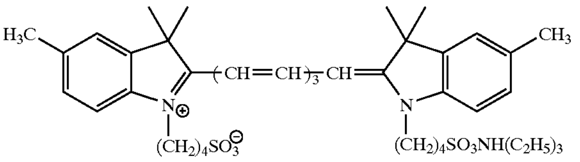

(I-11)

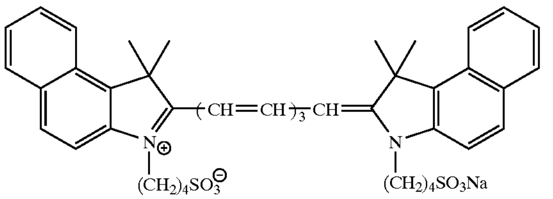

(I-12)

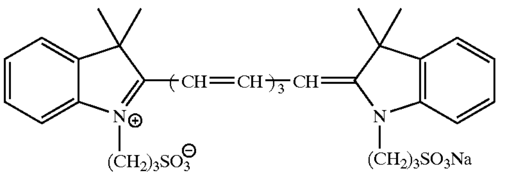

(I-13)

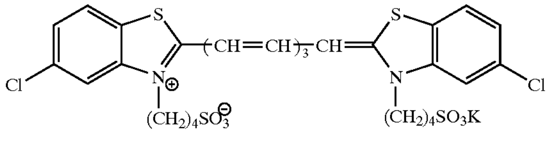

(I-14)

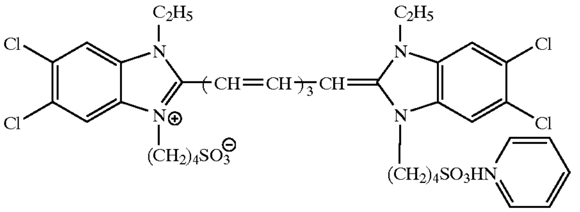

(I-15)

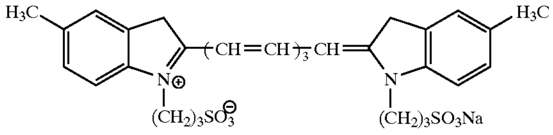

(I-16)

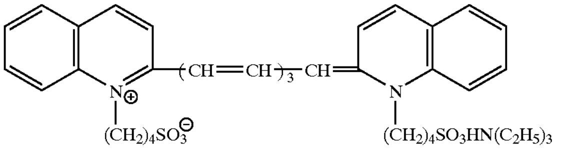

(I-17)

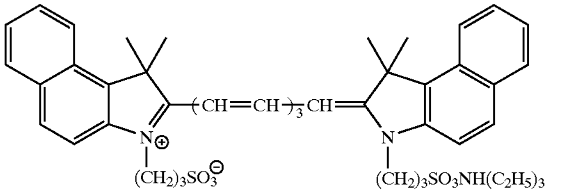

(I-18)

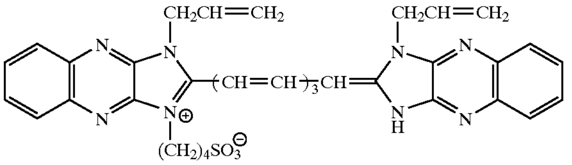

(I-19)

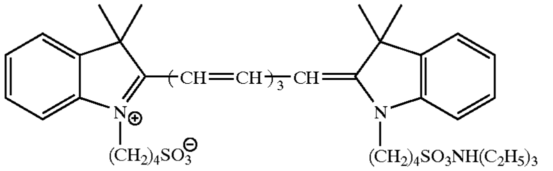

The compound represented by formula (B) can be easily synthesized in the same manner as in the normal synthesis of a carbocyanine dye. More specifically, the compound can be easily synthesized by reacting a heterocyclic enamine with an acetal such as $CH_3O—CH═CH—CH═CH—(OCH_3)_2$, a compound represented by PhN—CH—(CH—CH)—NHPh (wherein Ph represents a phenyl group), or the like. The synthesis method of the compound is specifically described, for example, in JP-A-5-116450.

The decomposition temperature of the light-to-heat converting substance is preferably 200° C. or more, more preferably 250° C. or more, from the standpoint that when the light-to-heat converting substance has a high decomposition temperature and is hardly decomposed, the problem of fogging due to coloration of the decomposition product of the light-to-heat converting substance can be prevented. If the decomposition temperature is less than 200° C., the coloration of a decomposition product produced by the decomposition of the light-to-heat converting substance causes fogging and decreases the image quality.

In the present invention, the compound represented by formula (B) is preferably contained as the main component of the light-to-heat converting substance in the light-to-heat conversion layer, but a conventionally known light-to-heat converting substance described above may be further contained in the light-to-heat conversion layer.

Examples of the matting agent contained in the light-to-heat conversion layer include an inorganic fine particle and an organic fine particle. Examples of the inorganic fine particle include metal salts such as silica, titanium oxide, aluminum oxide, zinc oxide, magnesium oxide, barium sulfate, magnesium sulfate, aluminum hydroxide, magnesium hydroxide and boron nitride, kaolin, clay, talc, zinc white, white lead, zieklite, quartz, kieselguhr, pearlite, bentonite, mica and synthetic mica. Examples of the organic fine particle include resin particles such as fluororesin particle, guanamine resin particle, acrylic resin particle, styrene-acryl copolymer resin particle, silicone resin particle, melamine resin particle and epoxy resin particle.

The particle size of the matting agent is usually from 0.3 to 30 μm, preferably from 0.5 to 20 μm, and the amount of the matting agent added is preferably from 0.1 to 100 $mg/m^2$.

The light-to-heat conversion layer may contain, if desired, a surfactant, a thickener, an antistatic agent and the like.

The light-to-heat conversion layer can be provided by preparing a coating solution having dissolved therein a light-to-heat converting substance and a binder and if desired, having added thereto a matting agent and other components, applying the coating solution onto a support and drying the solution. Examples of the organic solvent for dissolving the polyimide resin include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethylsulfoxide, dimethylformamide, dimethylacetamide, γ-butyrolactone, ethanol and methanol. The coating and drying may be performed by using normal coating and drying methods. The drying is usually performed at a temperature of 300° C. or less, preferably 200° C. or less. In the case of using polyethylene terephthalate as the support, the drying is preferably performed at a temperature of 80 to 150° C.

If the amount of the binder in the light-to-heat conversion layer is excessively small, the cohesion of the light-to-heat conversion layer decreases and at the time of transferring a formed image to an image-receiving sheet, the light-to-heat conversion layer is readily transferred together and this causes color mixing of the image, whereas if the amount of the polyimide resin is excessively large, the layer thickness of the light-to-heat conversion layer increases so as to achieve a constant light absorptivity and this readily incurs reduction in sensitivity. The mass ratio as the solid content between the light-to-heat converting substance and the binder in the light-to-heat conversion layer is preferably from 1:20 to 2:1, more preferably from 1:10 to 2:1.

As described above, reduction in the thickness of the light-to-heat conversion is preferred because the sensitivity of the thermal transfer sheet can be elevated. The thickness of the light-to-heat conversion layer is preferably from 0.03 to 1.0 μm, more preferably from 0.05 to 0.5 μm. Furthermore, the light-to-heat conversion layer preferably has an optical density of 0.80 to 1.26 for light at a wavelength of 808 nm, because the image-forming layer is enhanced in the transfer sensitivity. The optical density for light at the above-described wavelength is more preferably from 0.92 to 1.15. If the optical density at the laser peak wavelength is less than 0.80, the irradiated light is insufficiently converted into heat and the transfer sensitivity sometimes decreases. On the other hand, if the optical density exceeds 1.26, this affects the function of the light-to-heat conversion layer on recording and fogging may be generated.

(Image-Forming Layer)

The image-forming layer of the thermal transfer sheet contains at least a pigment which is transferred to an image-receiving sheet and forms an image, and further contains a binder for forming the layer and if desired, other components.

The pigment in general is roughly classified into an organic pigment and an inorganic pigment. These are appropriately selected according to use by taking account of their properties, that is, the former provides a coating film having high transparency and the latter generally exhibits excellent masking property. In the case of using a thermal transfer sheet having an image-forming layer with a color such as yellow (Y), magenta (M), cyan (C), black (G), green (G), orange (O), red (R), blue (B), gold (Go), silver (S) or ping (P), an organic or inorganic pigment having a color such as Y, M, C, X, G, O, R, B, Go, S or P is suitably used in the image-forming layer. Particularly, as for the organic pigment, an organic pigment having a color tone agreeing with or close to those generally used in the printing ink is preferably used.

Examples of the organic pigment which is suitably used include azo-type pigments, phthalocyanine-type pigments, anthraquinone-type pigments, dioxazine-type pigments, quinacridone-type pigments, isoindolinone-type pigments and nitro-type pigments.

Examples of the inorganic pigment includes inorganic compounds such as simple metal and metal oxide.

The pigments for use in the image-forming layer are described below by classifying these based on the color hue, but the present invention is not limited thereto.

1) Yellow Pigment

Pigment Yellow 12 (C.I. No. 21090):

Permanent Yellow DHG (produced by Clariant Japan), Lionol Yellow 1212B (produced by Toyo Ink Mfg. Co., Ltd.), Irgalite Yellow LCT (produced by Ciba Specialty Chemicals), Symuler Fast Yellow GTF 219 (produced by Dainippon Ink & Chemicals Inc.)

Pigment Yellow 13 (C.I. No. 21100):

Permanent Yellow GR (produced by Clariant Japan), Lionol Yellow 1313 (produced by Toyo Ink Mfg. Co., Ltd.)

Pigment Yellow 14 (C.I. No. 21095):

Permanent Yellow G (produced by Clariant Japan), Lionol Yellow 1401-G (produced by Toyo Ink Mfg. Co., Ltd.), Seika Fast Yellow 2270 (produced by Dainichiseika Color & Chemicals Mfg. Co., Ltd.), Symuler Fast Yellow 4400 (produced by Dainippon Ink & Chemicals Inc.)

Pigment Yellow 17 (C.I. No. 21105):

Permanent Yellow GG02 (produced by Clariant Japan), Symuler Fast Yellow 8GF (produced by Dainippon Ink & Chemicals Inc.)

Pigment Yellow 155:

Graphtol Yellow 3GP (produced by Clariant Japan)

Pigment Yellow 180 (C.I. No. 21290):

Novoperm Yellow P-HG (produced by Clariant Japan), PV Fast Yellow HG (produced by Clariant Japan)

Pigment Yellow 139 (C.I. No. 56298):

Novoperm Yellow M2R 70 (produced by Clariant Japan)

2) Magenta Pigment

Pigment Red 57:1 (C.I. No. 0.15850:1):

Graphtol Rubine L6B (produced by Clariant Japan), Lionol Red 6B-4290G (produced by Toyo Ink Mfg. Co., Ltd.), Irgalite Rubine 4BL (produced by Ciba Specialty Chemicals), Symuler Brilliant Carmine 6B-229 (produced by Dainippon Ink & Chemicals Inc.)

Pigment Red 122 (C.I. No. 73915):

Hosterperm Pink E (produced by Clariant Japan), Lionogen Magenta 5790 (produced by Toyo Ink Mfg. Co., Ltd.), Fastogen Super Magenta RH (produced by Dainippon Ink & Chemicals Inc.)

Pigment Red 53:1 (C.I. No. 15585:1):

Permanent Lake Red LCY (produced by Clariant Japan), Symuler Lake Red C conc (produced by Dainippon Ink & Chemicals Inc.)

Pigment Red 48:2 (C.I. No. 15865:2):

Permanent Red W2T (produced by Clariant Japan), Lionol Red LX235 (produced by Toyo Ink Mfg. Co., Ltd.), Symuler Red 3012 (produced by Dainippon Ink & Chemicals Inc.)

Pigment Red 177 (C.I. No. 65300):

Cromophtal Red A2B (produced by Ciba Specialty Chemicals)

3) Cyan Pigment:

Pigment Blue 15 (C.I. No. 74160):

Lionol Blue 7027 (produced by Toyo Ink Mfg. Co., Ltd.), Fastogen Blue BB (produced by Dainippon Ink & Chemicals Inc.)

Pigment Blue 15:1 (C.I. No. 74160):

Hosterperm Blue A2R (produced by Clariant Japan), Fastogen Blue 5050 (produced by Dainippon Ink & Chemicals Inc.)

Pigment Blue 15:2 (C.I. No. 74160):

Hosterperm Blue AFL (produced by Clariant Japan), Irgalite Blue BSP (produced by Ciba Specialty Chemicals), Fastogen Blue GP (produced by Dainippon Ink & Chemicals Inc.)

Pigment Blue 15:3 (C.I. No. 74160):

Hosterperm Blue B2G (produced by Clariant Japan), Lionol Blue FG7330 (produced by Toyo Ink Mfg. Co., Ltd.), Cromophtal Blue 4GNP (produced by Ciba Specialty Chemicals), Fastogen Blue FGF (produced by Dainippon Ink & Chemicals Inc.)

Pigment Blue 15:4 (C.I. No. 74160):

Hosterperm Blue BFL (produced by Clariant Japan), Cyanine Blue 700-10FG (produced by Toyo Ink Mfg. Co., Ltd.), Irgalite Blue GLNF (produced by Ciba Specialty Chemicals), Fastogen Blue FGS (produced by Dainippon Ink & Chemicals Inc.)

4) Black Pigment

Pigment Black 7 (Carbon Black C.I. No. 77266):

Mitsubishi Carbon Black MA100 (produced by Mitsubishi Chemical), Mitsubishi Carbon Black #5 (produced by Mitsubishi Chemical), Black Pearls 430 (produced by Cabot Co.)

5) White Pigment

ZnO and lithopone ($ZnO+BaSO_4$) in addition to those described above

6) Red Pigment

Pigment Red 48:1 (C.I. No. 15865:1):

Lionol Red 2B-FG3300 (produced by Toyo Ink Mfg. Co., Ltd.), Symuler Red NRY, Symuler Red 3108 (produced by Dainippon Ink & Chemicals Inc.)

Pigment Red 48:3 (C.I. No. 15865:3)

Permanent Red 3RL (produced by Clariant Japan), Symuler Red 2BS (produced by Dainippon Ink & Chemicals Inc.)

7) Blue Pigment

Pigment Blue 15:6 (C.I. No. 74160):

Lionol Blue ES (produced by Toyo Ink Mfg. Co., Ltd.)

Pigment Blue 60 (C.I. No. 69800):

Hosterperm Blue RL01: (produced by Clariant Japan), Lionogen Blue 6501 (produced by Toyo Ink Mfg. Co., Ltd.)

8) Green Pigment

Pigment Green 7 (C.I. No. 74260)

Fastogen Green S (produced by Dainippon Ink & Chemicals Inc.)

Pigment Green 36 (C.I. No. 74265)

Fastogen Green MY (produced by Dainippon Ink & Chemicals Inc.)

9) Orange Pigment

Pigment Orange 43 (C.I. No. 71105):

Hosterperm Orange GR (produced by Clariant Japan)

10) Gold Pigment mica, aluminum powder

11) Silver Pigment mica, aluminum powder

The pigment which can be used in the present invention may be appropriately selected from commercially available products by referring to, for example, *Ganryo Binran* (*Handbook of Pigments*), compiled by Nippon Ganryo Gijutsu Kyokai, Seibundo Shinkosha (1989), and *Color Index*, The Society of Dyes & Colorist, 3rd ed. (1987).

The average particle size of the pigment (except for titanium oxide for the present invention) is preferably from 0.03 to 1 $\mu$m, more preferably from 0.25 to 0.30 $\mu$m.

When the particle size is 0.03 $\mu$m or more, there arises no increase of the dispersion cost or no gelling or the like of the dispersion, and when the particle size is 1 $\mu$m or less, because of absence of coarse pigment particles in the pigment, good adhesion is obtained between the image-forming layer and the image-receiving layer and also, the transparency of the image-forming layer can be improved.

The binder for the image-forming layer is preferably an amorphous organic high-molecular polymer having a softening point of 40 to 150° C. Examples of the amorphous organic high-molecular polymer which can be used include butyral resin, polyamide resin, polyethyleneimine resin, sulfonamide resin, polyester polyol resin, petroleum resin, homopolymers and copolymers of styrene or a derivative or substitution product thereof (e.g., styrene, vinyl toluene, α-methylstyrene, 2-methylstyrene, chlorostyrene, vinylbenzoic acid, sodium vinylbenzenesulfonate, aminostyrene), and homopolymers and copolymers with another monomer of a vinyl-base monomer such as methacrylic acid esters (e.g., methyl methacrylate, ethyl methacrylate, butyl methacrylate, hydroxyethyl methacrylate), methacrylic acid, acrylic acid esters (e.g., methyl acrylate, ethyl acrylate, butyl acrylate, α-ethylhexyl acrylate), acrylic acid, dienes (e.g., butadiene, isoprene), acrylonitrile, vinyl ethers, maleic acid, maleic acid esters, maleic anhydride, cinnamic acid, vinyl chloride and vinyl acetate. These resins may be used in combination of two or more thereof.

The image-forming layer preferably contains the pigment in an amount of 30 to 70 mass %, more preferably from 30 to 50 mass %. Also, the image-forming layer preferably contains the resin in an amount of 70 to 30 mass %, more preferably from 70 to 40 mass %.

The image-forming layer may contain the following components (1) to (3) as other components.

(1) Waxes

The waxes include mineral waxes, natural waxes and synthetic waxes. Examples of the mineral wax include petroleum wax (e.g., paraffin wax, microcrystalline wax, ester wax, oxidized wax), montan wax, ozokerite and ceresine. Among these, paraffin wax is preferred. The paraffin wax is separated from petroleum and various products differing in the melting point are available on the market.

Examples of the natural wax include plant waxes such as carnauba wax, Japan wax, ouricury wax and espal wax, and animal waxes such as beeswax, insect wax, shellac wax and spermaceti wax.

The synthetic wax is generally used as a lubricant and usually comprises a higher fatty acid-base compound. Examples of the synthetic wax include the followings.

1) Fatty Acid Wax

Linear saturated fatty acids represented by the following formula:

$$CH_3(CH_2)_nCOOH$$

wherein n represents an integer of 6 to 28. Specific examples thereof include a stearic acid, a behenic acid, a palmitic acid, a 12-hydroxystearic acid and an azelaic acid.

In addition, metal salts (e.g., K, Ca, Zn, Mg) of the above-described fatty acids can be used.

2) Fatty Acid Ester Wax

Specific examples of the ester of the above-described fatty acids include ethyl stearate, lauryl stearate, ethyl behenate, hexyl behenate and behenyl myristate.

3) Fatty Acid Amide Wax

Specific examples of the amide of the above-described fatty acids include stearic acid amide and lauric acid amide.

4) Aliphatic Alcohol Wax

Linear saturated aliphatic alcohols represented by the following formula:

$$CH_3(CH_2)_nOH$$

wherein n represents an integer of 6 to 28. Specific examples thereof include stearyl alcohol.

Among these synthetic waxes 1) to 4), higher fatty acid amides such as stearic acid amide and lauric acid amide are preferred. The above-described wax compounds may be used, if desired, individually or in an appropriate combination.

(2) Plasticizer

The plasticizer is preferably an ester compound and examples thereof include known plasticizers such as phthalic acid esters (e.g., dibutyl phthalate, di-n-octyl phthalate, di(2-ethylhexyl)phthalate, dinonyl phthalate, dilauryl phthalate, butyllauryl phthalate, butylbenzyl phthalate), aliphatic dibasic acid esters (e.g., di(2-ethylhexyl)adipate, di(2-ethylhexyl)sebacate), phosphoric acid triesters (erg., tricresyl phosphate, tri(2-ethylhexyl) phosphate), polyol polyesters (e.g., polyethylene glycol ester) and epoxy compounds (e.g., epoxy fatty acid ester). Among these, esters of vinyl monomer, particularly esters of acrylic acid or methacrylic acid are preferred in view of effect brought about by the addition on the improvement in the transfer sensitivity or transfer unevenness and on the control of elongation to break.

Examples of the ester compound of acrylic acid or methacrylic acid include polyethylene glycol dimethacrylate, 1,2,4-butanetriol trimethacrylate, trimethylolethane triacrylate, pentaerythritol acrylate, pentaerythritol tetraacrylate and dipentaerythritol polyacrylate.

The plasticizer may be a polymer. In particular, a polyester is preferred because of its great addition effect and difficult diffusibility under storage conditions. Examples of the polyester include sebacic acid-base polyesters and adipic acid-base polyesters.

The additives contained in the image-forming layer are not limited to those described above. Also, the plasticizers may be used individually or in combination of two or more thereof.

If the content of the above-described additives in the image-forming layer is excessively large, the resolution of transferred image may decrease, the film strength of the image-forming layer itself may decrease or an unexposed area may be transferred to the image-receiving sheet due to reduction in the adhesive strength between the light-to-heat conversion layer and the image-forming layer. By taking account of these points, the wax content is preferably from 0.1 to 30 mass %, more preferably from 1 to 20 mass %, based on the entire solid content in the image-forming layer. The plasticizer content is preferably from 0.1 to 20 mass %, more preferably from 0.1 to 10 mass %, based on the entire solid content in the image-forming layer.

(3) Others

In addition to the above-described components, the image-forming layer may contain a surfactant, an inorganic or organic fine particle (e.g., metal powder, silica gel), an oil (e.g., linseed oil, mineral oil), a thickener, an antistatic agent and the like. Except for the case of obtaining a black image, when a substance capable of absorbing light at the wavelength of the light source used for the image recording is incorporated, the energy necessary for the transfer can be made small. The substance capable of absorbing light at the wavelength of the light source may be either a pigment or a dye, but in the case of obtaining a color image, use of an infrared light source such as semiconductor laser for the image recording and use of a dye having small absorption in the visible region and large absorption at the wavelength of the light source are preferred in view of the color reproduction. Examples of the near infrared dye include the compounds described in JP-A-3-103476.

The image-forming layer can be provided by preparing a coating solution having dissolved or dispersed therein the pigment, the binder and the like, applying the coating solution onto a light-to-heat conversion layer (when a heat-sensitive release layer which is described later is provided on the light-to-heat conversion layer, onto the heat-sensitive release layer), and drying the solution. Examples of the solvent used for the preparation of the coating solution include n-propyl alcohol, methyl ethyl ketone, propylene glycol monomethyl ether (MFG), methanol and water. The coating and drying can be performed by using normal coating and drying methods.

On the light-to-heat conversion layer of the thermal transfer sheet, a heat-sensitive release layer containing a heat-sensitive material which generates a gas or releases adhered water or the like under the action of heat generated from the light-to-heat conversion layer and thereby weakens the bonding strength between the light-to-heat conversion layer and the image-forming layer, may be provided. As such a heat-sensitive material, a compound (a polymer or a low molecular compound) capable of decomposing or denaturing by itself due to heat and generating a gas, a compound (a polymer or a low molecular compound) having absorbed or adsorbed therein a fairly large amount of an easily vaporizable gas such as moisture, or the like may be used. These may be used in combination.

Examples of the polymer capable of decomposing or denaturing due to heat and generating a gas include self-oxidizing polymers such as nitrocellulose; halogen-containing polymers such as chlorinated polyolefin, chlorinated rubber, polychlorinated rubber, polyvinyl chloride and polyvinylidene chloride; acrylic polymers such as polyisobutyl methacrylate having adsorbed therein a volatile compound (e.g., moisture); cellulose esters such as ethyl cellulose having adsorbed therein a volatile compound (e.g., moisture); and natural polymer compounds such as gelatin having adsorbed therein a volatile compound (e.g., moisture). Examples of the low molecular compound capable of decomposing or denaturing due to heat and generating a gas include compounds which undergo an exothermic decomposition and thereby generate a gas, such as diazo compound and azide compound.

The decomposition or denaturation of the heat-sensitive material due to heat preferably occurs at 280° C. or less, more preferably 230° C. or less.

In the case of using a low molecular compound as the heat-sensitive material of the heat-sensitive release layer, the compound is preferably combined with a binder. The binder used here may be the above-described polymer capable of decomposing or denaturing by itself due to heat and generating a gas, or may be a normal binder not having such property. When the heat-sensitive low molecular compound is used in combination with a binder, the mass ratio of the former to the latter is preferably from 0.02:1 to 3:1, more preferably from 0.05:1 to 2:1. The heat-sensitive release layer preferably covers almost the entire surface of the light-to-heat conversion layer. The thickness thereof is generally from 0.03 to 1 $\mu$m, preferably from 0.05 to 0.5 $\mu$m.

In the case of a thermal transfer sheet having a constitution such that a light-to-heat conversion layer, a heat-sensitive release layer and an image-forming layer are stacked in this order on a support, the heat-sensitive release layer undergoes decomposition or denaturation due to heat transmitted from the light-to-heat conversion layer and generates a gas. By this decomposition or generation of gas, the heat-sensitive release layer is partially lost or a cohesive failure takes place within the heat-sensitive release layer, as a result, the bonding strength between the light-to-heat conversion layer and the image-forming layer decreases. Accordingly, depending on the behavior of the heat-sensitive release layer, a part of the heat-sensitive release layer may adhere to the image-forming layer and appear on the finally formed image, giving rise to color mixing of the image. In order to avoid such a problem, the heat-sensitive release layer is preferably almost colorless, that is, highly transmissive to visible light, so that color mixing is not visually perceived in the formed image even if the above-described transfer of the heat-sensitive release layer takes place. Specifically, the light absorptivity of the heat-sensitive release layer is, for visible light, 50% or less, preferably 10% or less.

The thermal transfer sheet may also have a constitution such that in place of independently providing a heat-sensitive release layer, the above-described heat-sensitive material is added to the coating solution for the light-to-heat conversion layer and the formed light-to-heat conversion layer serves as a light-to-heat conversion layer and as a heat-sensitive release layer at the same time.

The outermost layer of the thermal transfer sheet in the side where the image-forming layer is provided preferably has a static friction coefficient of 0.35 or less, more preferably 0.20 or less. When the outermost layer is rendered to have a static friction coefficient of 0.35 or less, the thermal transfer sheet under transportation can be prevented from contamination of roll and the formed image can have high image quality. The coefficient of static friction is measured according to the method described in Japanese Patent Application No. 2000-85759, paragraph (0011).

The Smooster value on the surface of the image-forming layer is preferably from 0.5 to 50 mmHg (about 0.0665 to 6.65 kPa) at 23° C. and 55% RH and at the same time, the Ra value is preferably from 0.05 to 0.4 $\mu$m. With these values, a large number of microscopic voids formed on the contact surface to inhibit the contacting between the image-receiving layer and the image-forming layer can be reduced and this is advantageous in view of transfer and in turn image quality. The Ra value can be measured according to JIS B0601 by using a surface roughness meter (Surfcom, manufactured by Tokyo Seimitsu Co., Ltd.). The surface hardness of the image-forming layer is preferably 10 g or more with a sapphire needle. One second after the earth connection of the thermal transfer sheet which is electrified according to Federal Test Standard 4046, the charge potential of the image-forming layer is preferably from −100 to 100 V. The surface resistance of the image-forming layer is preferably $10^9$ Ω or less at 23° C. and 55% RH.

The image-receiving sheet which is used in combination with the above-described thermal transfer sheet is described below.

[Image-Receiving Sheet]

(Layer Constitution)

The image-receiving sheet usually has a constitution such that one or more image-receiving layer is provided on a support and if desired, one or more of a cushion layer, a release layer and an interlayer is provided between the support and the image-receiving layer. In view of the transportation, the image-receiving sheet preferably has a back layer on the surface of the support in the side opposite the image-receiving layer.

(Support)

Examples of the support include normal sheet-form substrates such as plastic sheet, metal sheet, glass sheet, resin coated paper, paper and various composite materials. Examples of the plastic sheet include polyethylene terephthalate sheet, polycarbonate sheet, polyethylene sheet, polyvinyl chloride sheet, polyvinylidene chloride sheet, polystyrene sheet, styrene-acrylonitrile sheet and polyester sheet. Examples of the paper which can be used include actual printing sheet and coated paper.

The support preferably has fine voids, because the image quality can be improved. Such a support can be produced as follows. For example, a thermoplastic resin and a filler comprising an inorganic pigment, a polymer incompatible with the thermoplastic resin or the like are mixed, the obtained mixture melt is shaped into a single-layer or multilayer film by using a melt extruder, and the resulting film is uniaxially or biaxially stretched. In this case, the void percentage is determined by the resin and filler selected, the mixing ratio, the stretching conditions and the like.

As the above-described thermoplastic resin, a polyolefin resin such as polypropylene, or a polyethylene terephthalate resin is preferred because of high crystallinity, good stretching property and easiness in the formation of voids. It is preferred to use the polyolefin resin or polyethylene terephthalate resin as the main component and appropriately use a small amount of another thermoplastic resin in combination. The inorganic pigment used as the filler preferably has an average particle size of 1 to 20 $\mu$m and examples of the inorganic pigment which can be used include calcium carbonate, clay, kieselguhr, titanium oxide, aluminum hydroxide and silica. As for the incompatible resin used as the filler, in the case of using polypropylene as the thermoplastic resin, a polyethylene terephthalate is preferably used in combination as the filler. The support having fine voids is described in detail in Japanese Patent Application No. 11-290570.

In the support, the content of the filler such as inorganic pigment is generally on the order of 2 to 30% by volume.

In the image-receiving sheet, the thickness of the support is usually from 10 to 400 $\mu$m, preferably from 25 to 200 $\mu$m. The surface of the support may be subjected to a surface treatment such as corona discharge treatment or glow discharge treatment so as to elevate the adhesive property with the image-receiving layer (or cushion layer) or the adhesive property with the image-forming layer of the thermal transfer sheet.

(Image-Receiving Layer)

For transferring and fixing the image-forming layer on the surface of the image-receiving sheet, one or more image-receiving layer is preferably provided on the support. The image-receiving layer is preferably formed of mainly an organic polymer binder. This binder is preferably a thermoplastic resin and examples thereof include homopolymers and copolymers of acrylic monomers such as acrylic acid, methacrylic acid, acrylic acid ester and methacrylic acid ester; cellulose-base polymers such as methyl cellulose, ethyl cellulose and cellulose acetate; homopolymers and copolymers of vinyl-base monomers, such as polystyrene, polyvinylpyrrolidone, polyvinyl butyral, polyvinyl alcohol and polyvinyl chloride; condensed polymers such as polyester and polyamide; and rubber-base polymers such as butadiene-styrene copolymer. For obtaining an appropriate adhesive strength with the image-forming layer, the binder of the image-receiving layer is preferably a polymer having a glass transition temperature (Tg) of less than 90° C. For this purpose, it is also possible to add a plasticizer to the image-receiving layer. Furthermore, the binder polymer preferably has a Tg of 30° C. or more so as to prevent blocking between sheets. In particular, from the standpoint of improving the adhesive property with the image-forming layer at the laser recording and elevating the sensitivity or image strength, the binder polymer of the image-receiving layer is preferably the same as or analogous to the binder polymer of the image-forming layer.

The Smooster value on the surface of the image-receiving layer is preferably from 0.5 to 50 mmHg (about 0.0665 to 6.65 kPa) at 23° C. and 55% RH and at the same time, the Ra value is preferably from 0.05 to 0.4 μm. With these values, a large number of microscopic voids formed on the contact face to inhibit the contacting between the image-receiving layer and the image-forming layer can be reduced and this is advantageous in view of transfer and in turn image quality. The Ra value can be measured according to JIS B0601 by using a surface roughness meter (Surfcom, manufactured by Tokyo Seimitsu Co., Ltd.). One second after the earth connection of the image-receiving sheet which is electrified according to Federal Test Standard 4046, the charge potential of the image-receiving layer is preferably from −100 to 100 V. The surface resistance of the image-receiving layer is preferably $10^9$ Ω or less at 23° C. and 55% RH. The coefficient of static friction is preferably 0.2 or less on the surface of the image-receiving layer and the surface energy on the surface of the image-receiving layer is preferably from 23 to 35 $mJ/m^2$.

In the case of once forming an image on the image-receiving layer and re-transferring the image to actual printing paper or the like, at least one image-receiving layer is preferably formed of a photocurable material. Examples of the composition for the photocurable material include a combination of a) a photopolymerizable monomer comprising at least one polyfunctional vinyl or vinylidene compound capable of forming a photopolymer by addition polymerization, b) an organic polymer, c) a photopolymerization initiator and if desired, additives such as thermopolymerization inhibitor. For the polyfunctional vinyl monomer, an unsaturated ester of polyol, particularly an ester of acrylic acid or methacrylic acid, such as ethylene glycol diacrylate and pentaerythritol tetraacrylate, is used.

Examples of the organic polymer include polymers described above as the polymer for the formation of the image-receiving layer. As for the photopolymerization initiator, a normal photoradical polymerization initiator such as benzophenone and Michler's ketone is used in a proportion of 0.1 to 20 mass % in the layer.

The thickness of the image-receiving layer is from 0.3 to 7 μm, preferably from 0.7 to 4 μm. When the thickness is 0.3 μm or more, the film strength can be ensured at the re-transfer to actual printing paper, and when the thickness is 4 μm or less, the gloss of image after the re-transfer to actual paper is suppressed and the approximation to a printed matter is enhanced.

(Other Layers)

A cushion layer may be provided between the support and the image-receiving layer. When a cushion layer is provided, the adhesive property between the image-forming layer and the image-receiving layer is improved at the laser thermal transfer and the image quality can be enhanced. Furthermore, even if foreign matters are mingled between the thermal transfer sheet and the image-receiving sheet at the recording, the size of void between the image-receiving layer and the image-forming layer is reduced due to deformation activity of the cushion layer, as a result, the size of image defect such as white spot can also be reduced. In addition, when an image is formed by the transfer and this image is transferred to separately prepared actual printing paper or the like, the image-receiving surface deforms according to the uneven surface of paper and therefore, the transferability of the image-receiving layer can be enhanced. Also, the gloss of the transferee decreases and thereby the approximation to a printed matter can be enhanced.

The cushion layer is preferably constituted to readily deform upon application of a stress onto the image-forming layer and for achieving the above-described effects, this layer is preferably formed of a material having a low modulus of elasticity, a material having rubber elasticity or a thermoplastic resin which is easily softened by heat. The elastic modulus of the cushion layer is preferably from 0.5 MPa to 1.0 GPa, more preferably from 1 MPa to 0.5 GPa, still more preferably from 10 to 100 MPa, at room temperature. Also, for burying foreign matters such as dust, the penetration (25° C., 100 g, 5 seconds) prescribed by JIS K2530 is preferably 10 or more the glass transition temperature of the cushion layer is 80° C. or less, preferably 25° C. or less, and the softening point is preferably from 50 to 200° C. For adjusting these physical properties, for example, Tg, a plasticizer may be suitably added into the binder.

Specific examples of the material used as the binder of the cushion layer include polyethylene, polypropylene, polyester, styrene-butadiene copolymers, ethylene-vinyl acetate copolymers, ethylene-acryl copolymers, vinyl chloride-vinyl acetate copolymers, vinylidene chloride resin, plasticizer-containing vinyl chloride resin, polyamide resin and phenol resin, in addition to rubbers such as urethane rubber, butadiene rubber, nitrile rubber, acryl rubber and natural rubber.

The thickness of the cushion layer varies depending on the resin used and other conditions but is usually from 3 to 100 μm, preferably from 10 to 52 μm.

The image-receiving layer and the cushion layer must be bonded until the laser recording stage but for transferring the image to actual printing paper, these layers are preferably provided in the separable state. In order to facilitate the separation, a release layer having a thickness of approximately from 0.1 to 2 μm is preferably provided between the cushion layer and the image-receiving layer. If the layer thickness is excessively large, the performance of the cushion layer cannot be easily brought out. Therefore, the layer thickness must be adjusted depending on the kind of the release layer.

Specific examples of the binder of the release layer include polyolefin, polyester, polyvinyl acetal, polyvinyl formal, polyparabanic acid, polymethyl methacrylate, polycarbonate, ethyl cellulose, nitrocellulose, methyl cellulose, carboxymethyl cellulose, hydroxypropyl cellulose, polyvinyl alcohol, polyvinyl chloride, urethane resin, fluorine-base resin, styrenes such as polystyrene and acrylonitrilestyrene, crosslinked products of these resins, thermosetting resins having a Tg of 65° C. or more, such as polyamide, polyimide, polyether imide, polysulfone, polyether sulfone and aramid, and cured products of these resins. The curing agent used here can be a general curing agent such as isocyanate and melanine.

On considering the above-described properties in the selection of the binder of the release layer, polycarbonate, acetal and ethyl cellulose are preferred in view of storability, and these are particularly preferred when an acrylic resin is used in the image-receiving layer, because good separation can be obtained at the retransfer of the image after laser thermal transfer.

Also, a layer which is extremely reduced in the adhesive property with the image-receiving layer on cooling may be used as the release layer. Specifically, a layer mainly comprising a heat-fusible compound such as waxes or binder, or a thermoplastic resin may be used.

Examples of the heat-fusible compound include the substances described in JP-A-63-193886. In particular, microcrystalline wax, paraffin wax and carnauba wax are preferred. Preferred examples of the thermoplastic resin include ethylene-base copolymers (e.g., ethylene-vinyl acetate resin) and cellulose-base resins.

In the release layer, a higher fatty acid, a higher alcohol, a higher fatty acid ester, an amide or a higher amine may be added as an additive, if desired.

In another constitution of the release layer, a layer which is fused or softened on heating and undertakes cohesive failure by itself, thereby causing separation, may be used. This release layer preferably contains a supercooling substance.

Examples of the supercooling substance include poly-ε-caprolactone, polyoxyethylene, benzotriazole, tribenzylamine and vanillin.

In still another constitution of the release layer, a compound capable of reducing the adhesive property with the image-receiving layer is incorporated. Examples of this compound include silicone-base resins such as silicone oil; fluorine-base resins such as Teflon and fluorine-containing acrylic resin; polysiloxane resin; acetal-base resins such as polyvinyl butyral, polyvinyl acetal and polyvinyl formal; solid waxes such as polyethylene wax and amide wax; and fluorine- or phosphoric acid ester-containing surfactants.

The release layer can be formed by a method where the above-described raw materials are dissolved or dispersed like a latex in a solvent and the solution or dispersion is coated on the cushion layer by a coating method such as blade coater, roll coater, bar coater, curtain coater or gravure coater or by an extrusion lamination method using hot melting. The release layer can also be formed by a method where the raw materials are dissolved or dispersed like a latex in a solvent, the solution or dispersion is coated on a temporary base using the above-described method, the obtained coating is attached to the cushion layer, and then the temporary base is removed.

The image-receiving sheet combined with the thermal transfer sheet may be constituted such that the image-receiving layer is serving also as the cushion layer. In this case, the image-receiving sheet may have a constitution of support/cushiony image-receiving layer, or a constitution of support/undercoat layer/cushiony image-receiving layer. Also in this case, the cushiony image-receiving layer is preferably provided in the separable state so as to enable the retransfer onto actual printing paper. If the case is so, the image after the retransfer onto actual printing paper can be an image having excellent gloss.

The thickness of the cushiony image-receiving layer is from 5 to 100 μm, preferably from 10 to 40 μm.

In the image-receiving sheet, a back layer is preferably provided on the surface of the support in the side opposite the surface where the image-receiving layer is provided, because the image-receiving sheet can be improved in the transportation property. For the purpose of attaining good transportation within the recording apparatus, the back layer preferably contains an antistatic agent such as surfactant and fine particulate tin oxide, and a matting agent such as silicon oxide and PMMA particle.

These additives can be added not only to the back layer but also, if desired, to the image-receiving layer or other layers. The kind of the additive varies depending on the purpose and cannot be indiscriminately specified, but, for example, in the case of a matting agent, particles having an average particle size of 0.5 to 10 μm may be added to the layer to a proportion of approximately from 0.5 to 80%. The antistatic agent may be appropriately selected from various surfactants and electrically conducting agents and used such that the surface resistance of the layer is $10^{22}$ Ω or less, preferably $10^{9}$ Ω or less, under the conditions of 23° C. and 50% RH.

For the binder used in the back layer, a general-purpose polymer may be used, such as gelatin, polyvinyl alcohol, methyl cellulose, nitrocellulose, acetyl cellulose, aromatic polyamide resin, silicone resin, epoxy resin, alkyd resin, phenol resin, melamine resin, fluororesin, polyimide resin, urethane resin, acrylic resin, urethane-modified silicone resin, polyethylene resin, polypropylene resin, polyester resin, Teflon resin, polyvinyl butyral resin, vinyl chloride-base resin, polyvinyl acetate, polycarbonate, organic boron compound, aromatic esters, fluorinated polyurethane and polyether sulfone.

When a crosslinkable water-soluble binder is used as the binder of the back layer, this is effective in preventing the matting agent from powder falling or improving the scratch resistance of the back layer. The use of this binder also provides a great effect on the blocking during storage.

For causing the crosslinking, any one of heat, active ray and pressure or a combination thereof may be used without any particular limitation according to the properties of the crosslinking agent used. Depending on the case, an arbitrary adhesive layer may be provided on the support in the side where the back layer is provided, so that adhesive property to the support can be imparted.

For the matting agent which is preferably added to the back layer, an organic or inorganic fine particle can be used. Examples of the organic matting agent include a fine particle of radical polymerization-type polymer such as polymethyl methacrylate (PMMA), polystyrene, polyethylene and polypropylene, and a fine particle of condensed polymer such as polyester and polycarbonate.

The back layer is preferably provided in a coated amount of approximately from 0.5 to 5 g/m$^2$. If the coated amount is less than 0.5 g/m$^2$, the coating property is unstable and problems such as powder falling of the matting agent are readily caused, whereas if it exceeds 5 g/m$^2$, the particle size of the suitable matting agent becomes very large and the image-receiving layer surface is embossed by the back layer during storage, as a result, missing or uneven formation of a recorded image readily occurs particularly in the thermal transfer of transferring a thin-film image-forming layer.

The matting agent preferably has a number average particle size 2.5 to 20 μm larger than the layer thickness of the back layer comprising only a binder. In the matting agent, particles having a particle size of 8 μm or more must be present in an amount of 5 mg/m$^2$ or more, preferably from 6 to 600 mg/m$^2$. By containing such a matting agent, the foreign matter failure can be improved. Also, by using a matting agent having a narrow particle size distribution such that the value σ/rn (=coefficient of variation in the particle size distribution) obtained by dividing the standard deviation of the particle size distribution by the number average particle size is 0.3 or less, the defect generated due to particles having an extraordinarily large particle size can be improved and moreover, a desired performance can be obtained by the addition in a smaller amount. This coefficient of variation is preferably 0.15 or less.

In the back layer, an antistatic agent is preferably added so as to prevent adhesion of foreign matters due to frictional electrification with a transportation roll. Examples of the antistatic agent which can be used include cationic surfactants, anionic surfactants, nonionic surfactants, polymer antistatic agents, electrically conducting fine particles and compounds over a wide range described in 11290 *no Kagaku Shohin* (11290 *Chemical Products*), Kagaku Kogyo Nippo Sha, pp. 875–876.

Among these substances as the antistatic agent which can be used in combination in the back layer, preferred are metal oxides such as carbon black, zinc oxide, titanium oxide and tin oxide, and electrically conducting fine particles such as organic semiconductor. In particular, electrically conducting fine particle is preferred, because the antistatic agent does not dissociate from the back layer and the antistatic effect can be stably obtained independently of the environment.

In the back layer, various activators or release agents such as silicone oil and fluorine-base resin may also be added so as to impart coatability or releasability.

The softening point of the back layer as measured by TMA (thermomechanical analysis) is preferably lower by 70° C. than the softening point of the cushion layer and the image-receiving layer.

The TMA softening point is determined by elevating the temperature of an object to be measured at a constant temperature-rising rate while applying a constant load, and observing the phase of the object. In the present invention, the temperature where the phase of the object to be measured starts changing is defined as the TMA softening point. The measurement of the softening point by TMA can be performed by using an apparatus such as Thermoflex manufactured by Rigaku Denki Sha.

In the image formation, the thermal transfer sheet and the image-receiving sheet can be used as a laminate body obtained by superposing the image-forming layer of the, thermal transfer sheet on the image-receiving layer of the image-receiving sheet.

The laminate body of the thermal transfer sheet and the image-receiving sheet can be formed by various methods. For example, the laminate body can be easily obtained by superposing the image-forming layer of the thermal transfer sheet on the image-receiving layer of the image-receiving sheet and passing these sheets between pressure and heating rollers. In this case, the heating temperature is preferably 160° C. or less, or 130° C. or less.

Another suitable method for obtaining the laminate body is the above-described vacuum contact method. In the vacuum contact method, an image-receiving sheet is first wound around a drum having provided thereon suction holes for vacuumization and then, a thermal transfer sheet having a slightly larger size than the image-receiving sheet is vacuum-contacted to the image-receiving sheet while uniformly expelling air by a squeeze roller. Other than this, a method where an image-receiving sheet is mechanically attached to a metal drum while pulling the image-receiving sheet and further thereon, a thermal transfer sheet is mechanically attached similarly while pulling the thermal transfer sheet, thereby contacting these sheets, may also be used. Among these methods, a vacuum contact method is preferred, because the temperature of heat roller and the like need not be controlled and the layers can be rapidly and uniformly stacked with ease.

EXAMPLES

The present invention is described in greater detail below by referring to Examples, however, the present invention should not be construed as being limited thereto. In Examples, unless otherwise indicated, the "parts"means "parts by mass".

Example 1

-Production of Thermal Transfer Sheet W-

[Formation of Back Layer]

[Preparation of Coating Solution for Back First Layer]

| | |
|---|---|
| Water dispersion of acrylic resin ("JURIMER ET410", solid content: 20 mass %, Nihon Junyaku Co., Ltd.) | 2 parts |
| Antistatic agent (water dispersion of tin oxide-antimony oxide) (average particle size: 0.1 μm, 17 mass %) | 7.0 parts |
| Polyoxyethylene phenyl ether | 0.1 part |
| Melamine compound ("SUMITICS Resin M-3", produced by Sumitomo Chemical Co., Ltd.) | 0.3 parts |
| Distilled water | to make a total of 100 parts |

[Formation of Back First Layer]

One surface (back surface) of a 75 μm-thick biaxially stretched polyethylene terephthalate support (Ra: 0.01 μm on both surfaces) was subjected to a corona treatment and the coating solution for the back first layer was coated thereon to a dry thickness of 0.03 μm and dried at 180° C. for 30 seconds to form a back first layer. The Young's modulus in the longitudinal direction of the support was 450 $kg/mm^2$ (=about 4.4 GPa) and the Young's modulus in the cross direction was 500 $kg/mm^2$ (=about 4.9 GPa). The F-5 value in the longitudinal direction of the support was 10 $kg/mm^{12}$ (=about 98 MPa) and the F-5 value in the cross direction of the support was 13 $kg/mm^2$ (=about 127.4 MPa). The heat shrinkage percentage of the support at 100° C. for 30 minutes was 0.3% in the longitudinal direction and 0.1% in the cross direction. The rupture strength was 20 $kg/mm^2$ (=about 196 MPa) in the longitudinal direction and 25 $kg/mm^2$ (=about 245 MPa) in the cross direction. The elastic modulus was 400 $kg/mm^2$ (=about 3.9 GPa).

[Preparation of Coating Solution for Back Second Layer]

| | |
|---|---|
| Polyolefin ("CHEMIPEARL S-120", 27 mass %, produced by Mitsui Petrochemical Industries, Ltd.) | 3.0 parts |
| Antistatic agent (water dispersion of tin oxide-antimony oxide) (average particle size: 0.1 μm, 17 mass %) | 2.0 parts |
| Colloidal silica ("SNOWTEX C", 20 mass %, produced by Nissan Chemicals Industries, Ltd.) | 2.0 parts |
| Epoxy compound ("DINACOL EX-614B", produced by Nagase Kasei K.K.) | 0.3 parts |
| Distilled water | to make a total of 100 parts |

[Formation of Back Second Layer]

The coating solution for the back second layer was coated on the back first layer to a dry thickness of 0.03 μm and then dried at 170° C. for 30 seconds to form a back second layer.

[Formation of Light-To-Heat Conversion Layer]

[Preparation of Coating Solution for Light-to-Heat Conversion Layer]

The following components were mixed while stirring with a stirrer to prepare a coating solution for the light-to-heat conversion layer.

[Composition of Coating Solution for Light-to-Heat Conversion Layer]

| | |
|---|---|
| Infrared light absorbing dye (Compound (I-17) represented by formula (B)) | 7.6 parts |
| Polyamideimide (compound represented by formula (A) wherein R is (6) above) | 29.3 parts |
| Exxon Naphtha | 5.8 parts |
| N-Methylpyrrolidone (NMP) | 1,500 parts |
| Methyl ethyl ketone | 360 parts |
| Surfactant ("Megafac F-176PF", produced by Dainippon Ink & Chemicals Inc., F-containing surfactant) | 0.5 parts |
| Matting agent dispersion having the following composition | 14.1 parts |

Preparation of Matting Agent Dispersion:

A true spherical silica fine particle ("SEAHOSTER KEP150", produced by Nippon Shokubai K.K.) having an average particle size of 1.5 μm (10 parts), 2 parts of a dispersant polymer ("JONCRYL 611", acrylic acid ester styrene copolymer, produced by Johnson Polymer), 16 parts of methyl ethyl ketone and 64 parts of N-methylpyrrolidone were mixed, and the resulting mixture was put in a 200 ml-volume polyethylene-made container together with 30 parts of glass bead having a diameter of 2 mm and dispersed for 2 hours by a paint shaker (manufactured by Toyo Seiki) to obtain a silica fine particle dispersion.

[Formation of Light-to-Heat Conversion Layer on Support Surface]

On one surface of the 75 μm-thick polyethylene terephthalate film (support), the coating solution for the light-to-heat conversion layer prepared above was coated by using a wire bar and then, the coating was dried for 2 minutes in an oven at 120° C. to form a light-to-heat conversion layer on the support. The optical density of the obtained light-to-heat conversion layer at a wavelength of 808 nm was measured by UV-spectrophotometer UV-240 manufactured by Shimadzu Corporation and found to be OD=0.93. The cross-section of the light-to-heat conversion layer was observed by a scanning electron microscope and the layer thickness was found to be 0.3 μm on average.

[Formation of Image-Forming Layer]

[Preparation of Coating Solution for White Image-Forming Layer]

Respective components shown below were charged into a mill of a kneader and a dispersion pretreatment was performed by applying a shear force while adding a slight amount of a solvent. To the obtained dispersion, the solvent was further added to finally have the following composition, and the resulting solution was dispersed in a sand mill for 2 hours to obtain a white pigment mother liquid dispersion.

[Composition of White Pigment Mother Liquid Dispersion]

| | |
|---|---|
| n-Propyl alcohol | 234.4 parts |
| Polyvinyl butyral ("Eslec B BL-SH", produced by Sekisui Chemical Co., Ltd.) | 22.7 parts |
| Titanium oxide (details are shown in Table 1) | 100 parts |

Then, the components shown below were mixed while stirring with a stirrer to prepare a coating solution for the white image-forming layer.

[Composition of Coating Solution for White Image-Forming Layer]

| | |
|---|---|
| n-Propyl alcohol | 792.82 parts |
| Methyl ethyl ketone | 288.55 parts |

Wax-Base Compounds:

| | |
|---|---|
| (Behenic acid amide, "DIAMID BM", produced by Nippon Kasei) | 2.04 parts |
| (Stearic acid amide, "NEWTRON 2", produced by Nippon Seika) | 2.04 parts |
| (Lauric acid amide, "DIAMID Y", produced by Nippon Kasei) | 2.04 parts |
| (Palmitic acid amide, "DIAMID KP", produced by Nippon Kasei) | 2.04 parts |
| (Oleic acid amide, "DIAMID O-200", produced by Nippon Kasei) | 2.04 parts |
| (Erucic acid amide, "DIAMID L-200", produced by Nippon Kasei) | 2.04 parts |
| Rosin ("KE-311", produced by Arakawa Kagaku) (component: 80 to 97% of resin acid; resin acid components: 30 to 40% of abietic acid, 10 to 20% of neoabietic acid, 14% of dihydroabietic acid, 14% of tetrahydroabietic acid) | 5.91 parts |
| White pigment mother liquid dispersion | 537.20 parts |
| Surfactant ("Megafac F-780F", solid content: 30%, produced by Dainippon Ink & Chemicals Inc.) | 17.10 parts |

[Formation of White Image-Forming Layer on Light-to-Heat Conversion Layer Surface]

On the surface of the light-to-heat conversion layer formed above, the coating solution for the white image-forming layer prepared above was coated by using a wire bar for 1 minute and then, the coating was dried for 2 minutes in an oven at 100° C. to form a white image-forming layer on the light-to-heat conversion layer. At the coating of this image-forming layer, the layer thickness was adjusted to give a reflection OD of 0.30. Through these steps, a thermal transfer sheet W where a light-to-heat conversion layer and a white image-forming layer were provided in this order on a support was produced.

The thickness of the white image-forming layer in the thermal transfer sheet W was measured and found to be 0.8 μm on average.

The obtained image-forming layer had the following physical properties.

The surface hardness of the image-forming layer, which is preferably 10 g or more with a sapphire needle, was 200 g or more.

The contact angle of water was 48.1°.

-Production of Thermal Transfer Sheet Y-

The thermal transfer sheet Y was produced in the same manner as in Production of Thermal Transfer Sheet W except for using a coating solution for yellow image-forming layer having a composition shown below in place of the coating solution for white image-forming layer in Production of Thermal Transfer Sheet W. The thickness of the image-forming layer in the thermal transfer sheet Y obtained was 0.42 μm.

[Composition of Yellow Pigment Mother Liquid Dispersion]
Yellow Pigment Composition 1:

| | |
|---|---|
| Polyvinyl butyral ("Eslec B BL-SH", produced by Sekisui Chemical Co., Ltd.) | 7.1 parts |
| Yellow pigment (Pigment Yellow 180 (C.I. No. 21290) ("Novoperm Yellow P-HG", produced by Clariant Japan)) | 12.9 parts |
| Pigment dispersant ("SOLSPERSE S-20000", produced by ICI) | 0.6 parts |
| n-Propyl alcohol | 79.4 parts |

[Composition of Yellow Pigment Mother Liquid Dispersion]
Yellow Pigment Composition 2:

| | |
|---|---|
| Polyvinyl butyral ("Eslec B BL-SH", produced by Sekisui Chemical Co., Ltd.) | 7.1 parts |
| Yellow pigment (Pigment Yellow 139 (C.I. No. 56298) ("Novoperm Yellow M2R 70", produced by Clariant Japan) | 12.9 parts |
| Pigment dispersant ("SOLSPERSE S-20000", produced by ICI) | 0.6 parts |
| n-Propyl alcohol | 79.4 parts |

[Composition of Coating Solution for Yellow Image-Forming Layer]

| | |
|---|---|
| Yellow pigment mother liquid dispersion prepared above [Yellow Pigment Composition 1:Yellow Pigment Composition 2 = 95:5 (by part)] | 126 parts |
| Polyvinyl butyral ("Eslec B BL-SH", produced by Sekisui Chemical Co., Ltd.) | 4.6 parts |

Wax-Base Compounds:

| | |
|---|---|
| (Stearic acid amide, "NEWTRON 2", produced by Nippon Seika) | 0.7 parts |
| (Behenic acid amide, "DIAMID BM", produced by Nippon Kasei) | 0.7 parts |
| (Lauric acid amide, "DIAMID Y", produced by Nippon Kasei) | 0.7 parts |
| (Palmitic acid amide, "DIAMID KP", produced by Nippon Kasei) | 0.7 parts |
| (Erucic acid amide, "DIAMID L-200", produced by Nippon Kasei) | 0.7 parts |
| (Oleic acid amide, "DIAMID O-200", produced by Nippon Kasei) | 0.7 parts |
| Nonionic surfactant ("CHEMISTAT 1100", produced by Sanyo Kasei) | 0.4 parts |
| Rosin ("KE-311", produced by Arakawa Kagaku) | 2.4 parts |
| Surfactant ("Megafac F-176PF", solid content: 20%, produced by Dainippon Ink & Chemicals Inc.) | 0.8 parts |
| n-Propyl alcohol | 793 parts |
| Methyl ethyl ketone | 198 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 2.3 mmHg (=about 0.31 kPa).

The coefficient of static friction on the surface, which is preferably 0.2 or less, was 0.1.

The surface energy was 24 $mJ/mm^2$ and the contact angle of water was 108.1°.

When recording was performed by using laser light under the conditions that the light intensity on the exposure surface was, 1,000 $W/mm^2$ or more and the linear velocity was 1 m/sec or more, the percentage deformation of the light-to-heat conversion layer was 150%.

-Production of Thermal Transfer Sheet M-

The thermal transfer sheet M was produced in the same manner as in Production of Thermal Transfer Sheet W except for using a coating solution for magenta image-forming layer having a composition shown below in place of the coating solution for white image-forming layer in Production of Thermal Transfer Sheet W. The thickness of the image-forming layer in the thermal transfer sheet M obtained was 0.38 μm.

[Composition of Magenta Pigment Mother Liquid Dispersion]
Magenta Pigment Composition 1:

| | |
|---|---|
| Polyvinyl butyral ("DENKA BUTYRAL #2000-L", produced by Electrochemical Industry Co., Ltd., Vicat softening point: 57° C.) | 12.6 parts |
| Pigment (Pigment Red 57:1 (C.I. No. 15850:1) ("Symuler Brilliant Carmine 6B-229", produced by Dainippon Ink & Chemicals Inc.)) | 15.0 parts |
| Pigment dispersant ("SOLSPERSE S-20000", produced by ICI) | 0.6 parts |
| n-Propyl alcohol | 80.4 parts |

[Composition of Magenta Pigment Mother Liquid Dispersion]
Magenta Pigment Composition 2:

| | |
|---|---|
| Polyvinyl butyral ("DENKA BUTYRAL #2000-L", produced by Electrochemical Industry Co., Ltd., Vicat softening point: 57° C.) | 12.6 parts |
| Pigment (Pigment Red 57:1 (C.I. No. 15850:1) ("Lionol Red 6B-4290G", produced by Toyo Ink Mfg. Co., Ltd.)) | 15.0 parts |
| Pigment dispersant ("SOLSPERSE S-20000", produced by ICI) | 0.6 parts |
| n-Propyl alcohol | 79.4 parts |

[Composition of Coating Solution for Magenta Image-Forming Layer]

| | |
|---|---|
| Magenta pigment mother liquid dispersion prepared above [Magenta Pigment Composition 1:Magenta Pigment Composition 2 = 95:5 (by part)] | 163 parts |
| Polyvinyl butyral ("DENKA BUTYRAL #2000-L", produced by Electrochemical Industry Co., Ltd., Vicat softening point: 57° C.) | 4.0 parts |

Wax-Base Compounds:

| | |
|---|---|
| (Stearic acid amide, "NEWTRON 2", produced by Nippon Seika) | 1.0 part |
| (Behenic acid amide, "DIAMID BM", produced by Nippon Kasei) | 2.0 parts |
| (Palmitic acid amide, "DIAMID KP", produced by Nippon Kasei) | 1.0 part |
| (Erucic acid amide, "DIAMID L-200", produced by Nippon Kasei) | 1.0 part |
| (Oleic acid amide, "DIAMID O-200", produced by Nippon Kasei) | 1.0 part |
| Nonionic surfactant ("CHEMISTAT 1100", produced by Sanyo Kasei) | 0.7 parts |
| Rosin ("KE-311", produced by Arakawa Kagaku) | 4.6 parts |
| Pentaerythritol tetraacrylate ("NK Ester A-TMMT", produced by Shin Nakamura Kagaku) | 2.5 parts |
| Surfactant ("Megafac F-17GPF", solid content: 20%, produced by Dainippon Ink & Chemicals Inc.) | 1.3 parts |
| n-Propyl alcohol | 848 parts |
| Methyl ethyl ketone | 246 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 3.5 mmHg (=about 0.47 kPa).

The coefficient of static friction on the surface, which is preferably 0.2 or less, was 0.08.

The surface energy was 25 $mJ/m^2$ and the contact angle of water was 98.8°.

When recording was performed by using laser light under the conditions that the light intensity on the exposure surface was 1,000 $W/mm^2$ or more and the linear velocity was 1 m/sec or more, the percentage deformation of the light-to-heat conversion layer was 160%.

-Production of Thermal Transfer Sheet C-

The thermal transfer sheet C was produced in the same manner as in Production of Thermal Transfer Sheet W except for using a coating solution for cyan image-forming layer having a composition shown below in place of the coating solution for white image-forming layer in Production of Thermal Transfer Sheet W. The thickness of the image-forming layer in the thermal transfer sheet C obtained was 0.45 μm.

[Composition of Cyan Pigment Mother Liquid Dispersion]
Cyan Pigment Composition 1:

| | |
|---|---|
| Polyvinyl butyral ("Eslec B BL-SH", produced by Sekisui Chemical Co., Ltd.)) | 12.6 parts |
| Pigment (Pigment Blue 15:4 (C.I. No. 74160) ("Cyanine Blue 700-10FG", produced by Toyo Ink Mfg. Co., Ltd.)) | 15.0 parts |
| Pigment dispersant ("PW-36", produced by Kusumoto Kasei) | 0.8 parts |
| n-Propyl alcohol | 110 parts |

[Composition of Cyan Pigment Mother Liquid Dispersion]
Cyan Pigment Composition 2:

| | |
|---|---|
| Polyvinyl butyral ("Eslec B BL-SH", produced by Sekisui Chemical Co., Ltd.)) | 12.6 parts |
| Pigment (Pigment Blue 15 (C.I. No. 74160) ("Lionol Blue 7027", produced by Toyo Ink Mfg. Co., Ltd.)) | 15.0 parts |
| Pigment dispersant ("PW-36", produced by Kusumoto Kasei) | 0.8 parts |
| n-Propyl alcohol | 110 parts |

[Composition of Coating Solution for Cyan Image-Forming Layer]

| | |
|---|---|
| Cyan pigment mother liquid dispersion prepared above [Cyan Pigment Composition 1:Cyan Pigment Composition 2 = 90:10 (by part)] | 118 parts |
| Polyvinyl butyral ("Eslec B BL-SH", produced by Sekisui Chemical Co., Ltd.)) | 5.2 parts |
| Inorganic pigment "MEK-ST" | 1.3 parts |

Wax-Base Compounds:

| | |
|---|---|
| (Stearic acid amide, "NEWTRON 2", produced by Nippon Seika) | 1.0 part |
| (Behenic acid amide, "DIAMID BM", produced by Nippon Kasei) | 1.0 part |
| (Lauric acid amide, "DIAMID Y", produced by Nippon Kasei) | 1.0 part |
| (Palmitic acid amide, "DIAMID KP", produced by Nippon Kasei) | 1.0 part |
| (Erucic acid amide, "DIAMID L-200", produced by Nippon Kasei) | 1.0 part |
| (Oleic acid amide, "DIAMID O-200", produced by Nippon Kasei) | 1.0 part |
| Rosin ("KE-311", produced by Arakawa Kagaku) | 2.8 parts |
| Pentaerythritol tetraacrylate ("NK Ester A-TMMT", produced by Shin Nakamura Kagaku) | 1.7 parts |
| Surfactant ("Megafac F-176PF", solid content: 20%, produced by Dainippon Ink & Chemicals Inc.) | 1.7 parts |
| n-Propyl alcohol | 890 parts |
| Methyl ethyl ketone | 247 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 7.0 mmHg (=about 0.93 kPa).

The coefficient of static friction on the surface, which is preferably 0.2 or less, was 0.08.

The surface energy was 25 $mJ/m^2$ and the contact angle of water was 98.8°.

When recording was performed by using laser light under the conditions that the light intensity on the exposure surface was 1,000 $W/mm^2$ or more and the linear velocity was 1 m/sec or more, the percentage deformation of the light-to-heat conversion layer was 165%.

-Production of Thermal Transfer Sheet K-

The thermal transfer sheet K was produced in the same manner as in Production of Thermal Transfer Sheet W except for using a coating solution for black image-forming layer having a composition shown below in place of the coating solution for red image-forming layer in Production of Thermal Transfer Sheet W. The thickness of the image-forming layer in the thermal transfer sheet K obtained was 0.60 μm.

[Preparation of Coating Solution for Black Image-Forming Layer]

Respective components shown below were charged into a mill of a kneader and a dispersion pretreatment was performed by applying a shear force while adding a slight amount of a solvent. To the obtained dispersion, the solvent was further added to finally have the following composition, and the resulting solution was dispersed in a sand mill for 2 hours to obtain a pigment mother liquid dispersion.

[Composition of Black Pigment Mother Liquid Dispersion]

Composition 1:

| | |
|---|---|
| Polyvinyl butyral ("Eslec B BL-SH", produced by Sekisui Chemical Co., Ltd.) | 12.6 parts |
| Pigment (Pigment Black 7 (Carbon Black C.I. No. 77266) ("Mitsubishi Carbon Black #5", produced by Mitsubishi Chemical, PVC blackness: 1)) | 4.5 parts |
| Dispersion aid ("SOLSPERSE S-20000", produced by ICI) | 0.8 parts |
| n-Propyl alcohol | 79.4 parts |

Composition 2:

| | |
|---|---|
| Polyvinyl butyral ("Eslec B BL-SH", produced by Sekisui Chemical Co., Ltd.) | 12.6 parts |
| Pigment (Pigment Black 7 (Carbon Black C.I. No. 77266) ("Mitsubishi Carbon Black MA-100", produced by Mitsubishi Chemical, PVC blackness: 10)) | 10.5 parts |
| Dispersion aid ("SOLSPERSE S-20000", produced by ICI) | 0.8 parts |
| n-Propyl alcohol | 79.4 parts |

Then, the components shown below were mixed while stirring with a stirrer to prepare a coating solution for the black image-forming layer.

[Composition of Coating Solution for Black Image-Forming Layer]

| | |
|---|---|
| Black pigment mother liquid dispersion prepared above [Composition 1: Composition 2 = 70:30 (by part)] | 185.7 parts |
| Polyvinyl butyral ("Eslec B BL-SH", produced by Sekisui Chemical Co., Ltd.) | 11.9 parts |

| | |
|---|---|
| (Stearic acid amide, "NEWTRON 2", produced by Nippon Seika) | 1.7 parts |
| (Behenic acid amide, "DIAMID BM", produced by Nippon Kasei) | 1.7 parts |
| (Lauric acid amide, "DIAMID Y", produced by Nippon Kasei) | 1.7 parts |
| (Palmitic acid amide, "DIAMID KP", produced by Nippon Kasei) | 1.7 parts |

-continued

| | |
|---|---|
| (Erucic acid amide, "DIAMID L-200", produced by Nippon Kasei) | 1.7 parts |
| (Oleic acid amide, "DIAMID O-200", produced by Nippon Kasei) | 1.7 parts |
| Rosin ("KE-311", produced by Arakawa Kagaku) (component: 80 to 97% of resin acid; resin acid components: 30 to 40% of abietic acid, 10 to 20% of neoabietic acid, 14% of dihydroabietic acid, 14% of tetrahydroabietic acid) | 11.4 parts |
| Surfactant ("Megafac F-176PF", solid content: 20%, produced by Dainippon Ink & Chemicals Inc.) | 2.1 parts |
| Inorganic pigment ("MEK-ST", 30% methyl ethyl ketone solution, produced by Nissan Chemicals Industries, Ltd.) | 7.1 parts |
| n-Propyl alcohol | 1,050 parts |
| Methyl ethyl ketone | 295 parts |

The particles in the obtained coating solution for the black image-forming layer were measured by a particle size distribution meter employing a laser scattering system, as a result, the average particle size was 0.25 μm and the proportion of particles of 1 μm or more was 0.5%.

The obtained image-forming layer had the following physical properties.

The surface hardness of the image-forming layer, which is preferably 10 g or more with a sapphire needle, was 200 g or more.

The Smooster value on the surface was 9.3 mmHg (1.24 kPa).

The coefficient of static friction on the surface, which is preferably 0.2 or less, was 0.08.

The surface energy was 29 $mJ/m^2$, the contact angle of water was 94.8°, the reflection optical density was 1.82, the layer thickness was 0.60 μm and the OD/layer thickness was 3.03.

When recording was performed by using laser light under the conditions that the light intensity on the exposure surface was 1,000 $W/mm^2$ or more and the linear velocity was 1 m/sec or more, the percentage deformation of the light-to-heat conversion layer was 168%.

-Production of Image-Receiving Sheet-

A coating solution for the cushion layer and a coating solution for the image-receiving layer each having the following composition were prepared.

1) Coating Solution for Cushion Layer

| | |
|---|---|
| Vinyl chloride-vinyl acetate copolymer (main binder) ("MPR-TSL", produced by Nisshin Kagaku) | 20 parts |
| Plasticizer ("PARAPLEX G-40", produced by CP. HALL. COMPANY) | 10 parts |
| Surfactant (fluorine-containing surfactant, coating aid) ("Megafac F-177", produced by Dainippon Ink & Chemicals Inc.) | 0.5 parts |
| Antistatic agent (quaternary ammonium salt) ("SAT-5 Supper (IC)", produced by Nihon Junyaku Co., Ltd.) | 0.3 parts |
| Methyl ethyl ketone | 60 parts |
| Toluene | 10 parts |
| N,N-Dimethylformamide | 3 parts |

2) Coating Solution for Image-Receiving Layer

| | |
|---|---|
| Polyvinyl butyral ("Eslec B BL-SH", produced by Sekisui Chemical Co., Ltd.) | 8 parts |
| Antistatic agent ("SANSTAT 2012A", produced by Sanyo Kasei) | 0.7 parts |
| Surfactant ("Megafac F-176PF", solid content: 20%, produced by Dainippon Ink & Chemicals Inc.) | 0.1. part |
| n-Propyl alcohol | 20 parts |
| Methanol | 20 parts |
| 1-Methoxy-2-propanol | 50 parts |

The coating solution for the formation of cushion layer prepared above was coated on a white PET support ("LUMIRROR #130E58", produced by Toray Industries, Inc., thickness: 130 μm) by using a small-width coating machine and then, the coated layer was dried. Thereafter, the coating solution for the image-receiving layer was coated and dried. The coated amounts were adjusted to form a cushion layer having a dry thickness of about 20 μm and an image-receiving layer having a dry thickness of about 2 μm. The white PET support was a void-containing plastic support comprising a laminate body (total thickness: 130 μm, specific gravity: 0.8) consisting of a void-containing polyethylene terephthalate layer (thickness: 116 μm, porosity: 20%) and titanium oxide-containing polyethylene terephthalate layers (thickness; 7 μm, titanium oxide content: 2%) provided on both surfaces of the void-containing polyethylene terephthalate layer. The produced image-receiving sheet was taken up into a roll form and stored at room temperature for 1 week. Thereafter, this image-receiving sheet was used for image recording by laser light described below.

The obtained image-receiving layer had the following physical properties.

The surface roughness Ra, which is preferably from 0.4 to 0.01 μm, was 0.02 μm.

The waviness on the image-receiving layer surface, which is preferably 2 μm or less, was 1.2 μm.

The Smooster value on the image-receiving layer surface, which is preferably from 0.5 to 50 mmHg (=about 0.0665 to 6.65 kPa) at 23° C. and 55% RH, was 0.8 mmHg (=about 0.11 kPa).

The coefficient of static friction on the image-receiving layer surface, which is preferably 0.8 or less, was 0.37.

The surface energy of the image-receiving layer was 29 $mJ/m^2$ and the contact angle of water was 85°.

In this way, a multicolor image forming material comprising thermal transfer sheets W, Y, M, C and K and an image-receiving sheet was obtained.

Example 2 and Comparative Examples 1 to 4

Thermal transfer sheets W and multicolor image forming materials were obtained in the same manner as in Example 1 except for changing the titanium oxide and the thickness of the image-forming layer as shown in Table 1. Incidentally, at the coating of the image-forming layer on the light-to-heat conversion layer, the layer thickness was adjusted to give a reflection OD of 0.30.

The multicolor image forming materials obtained each was determined on the (reflection OD/thickness of image-forming layer) of the thermal transfer sheet W. Also, by using each thermal transfer sheet W, the recording sensitivity was evaluated.

-Formation of Transferred Image-

The image forming system used was the system shown in FIG. 4 and Luxel FINALPROOF 5600 was employed as the recording apparatus, The transferred image on a transferee was obtained according to the image formation sequence of this system by the transferee transfer method for use in this system.

The image-receiving sheet (56 cm×79 cm) produced above was wound around a 38 cm-diameter rotary drum having punched thereon vacuum section holes (plane density; 1 hole per area of 3 cm×8 cm) each having a diameter of 1 mm, and vacuum-adsorbed. Subsequently, the thermal transfer sheet K produced above, which was cut into 61 cm×84 cm, was superposed to uniformly protrude from the image-receiving sheet, and contact-laminated while suctioning air through the section holes by squeezing the sheet with a squeeze roller. The pressure reduction degree in the state of the section holes being closed was −150 mmHg (=about 81.13 kPa) based on 1 atm. The drum was rotated and the surface of the laminate body on the drum was irradiated with semiconductor laser light at a wavelength of 808 nm from the outside by converging the light to form a spot of 7 μm on the surface of the light-to-heat conversion layer. While moving the light toward the direction (sub-scanning) right-angled to the rotating direction (main scanning direction) of the rotary drum, an image was recorded by laser on the laminate body. The laser irradiation conditions were as follows. The laser beam used in this Example was a laser beam having a multi-beam two-dimensional arrangement comprising parallelograms forming 5 lines in the main scanning direction and 3 lines in the sub-scanning direction.

| | |
|---|---|
| Laser power: | 110 mW |
| Rotation number of drum | 500 rpm |
| Sub-scanning pitch | 6.35 μm |

Ambient humidity and temperature:

three conditions of 20° C. and 40%, 23° C. and 50% and 26° C. and 65%

The diameter of exposure drum, which is preferably 360 mm or more, was 380 mm.

The image size was 515 mm×728 mm and the resolution was 2,600 dpi.

Also, using sequentially the thermal transfer sheets C, M and Y in place of the thermal transfer sheet K, the laser light was imagewise irradiated on each image-forming layer, the irradiated regions were sequentially transferred and stacked on the image-receiving sheet to form a predetermined multicolor image on the image-receiving sheet and after performing solid recording of the thermal transfer sheet W on the formed multicolor image, the image was re-transferred on a transparent plastic film ("Merinex 709", produced by Teijin DuPont Films) by a thermal transfer apparatus, as a result, a clear multicolor image was obtained.

The thermal transfer apparatus used was a transfer apparatus where the coefficient of dynamic friction to polyethylene terephthalate as the construction material of the insertion table is from 0.1 to 0.7 and the transportation speed is from 15 to 50 m/sec. The Vickers hardness of the construction material for the heat roll of the thermal transfer sheet, which is preferably from 10 to 100, was 70.

The sensitivity of the thermal transfer sheet W was evaluated as follows.

-Evaluation of Sensitivity-

A solid image was recorded and the irradiation energy of laser light necessary for the gapless filling of solid image was determined.

The results are shown in Table 1.

TABLE 1

| | Titanium Oxide | | | | | Image-Forming Layer | | | |
|---|---|---|---|---|---|---|---|---|---|
| | Product of Tayca Corp. | Crystal Form | Surface Coating | Surface Coverage (%) | Particle Size (μm) | Thickness (μm) | Reflection OD | Reflection OD/Layer Thickness | Sensitivity $mJ/cm^2$ |
| Example 1 | JR805 | rutile | alumina/silica | 8 | 0.29 | 1.6 | 0.3 | 0.188 | 289 |
| Example 2 | JR806 | rutile | alumina/silica | 6 | 0.26 | 1.9 | 0.3 | 0.158 | 225 |
| Comparative Example 1 | JR600E | rutile | alumina | 4 | 0.27 | 2.4 | 0.3 | 0.125 | 372 |
| Comparative Example 2 | JR600A | rutile | alumina | 2.5 | 0.25 | 2.4 | 0.3 | 0.125 | 372 |
| Comparative Example 3 | JR405 | rutile | alumina | 0.8 | 0.21 | 2.8 | 0.3 | 0.107 | 650 or more |
| Comparative Example 4 | JA1 | anatase | none | none | 0.18 | 3.7 | 0.3 | 0.081 | 650 or more |

As is apparent, in the multicolor image forming materials of Examples 1 and 2 where the image-forming layer of the thermal transfer sheet W contains the titanium oxide for the present invention, the multicolor image with a white base on the transparent plastic film is clearly seen in either environment, revealing effectiveness as a package, and the recording sensitivity is high.

On the other hand, in the thermal transfer sheets W not using the titanium oxide for the present invention in the image-forming layer of the thermal transfer sheet W, the layer thickness is large and the recording sensitivity is low.

This application is based on Japanese Patent application JP 2003-271836, filed Jul. 8, 2003, the entire content of which is hereby incorporated by reference, the same as if set forth at length.

What is claimed is:

1. A laser thermal transfer multicolor image forming material comprising an image-receiving sheet containing an image-receiving layer and a thermal transfer sheet containing a light-to-heat conversion layer, an image-forming layer and a support, which comprises a white thermal transfer sheet containing in the image-forming layer a titanium oxide having a particle size of 0.2 to 0.4 μm with the particle surfaces being coated by alumina and silica, wherein the coverage of alumina and silica on the titanium oxide is 6 to 9 weight %, based on the weight of the coated titanium oxide.

2. The laser thermal transfer multicolor image forming material according to claim 1, wherein the titanium oxide is a rutile type.

3. The laser thermal transfer multicolor image forming material according to claim 1, wherein in the image-forming layer of the white thermal transfer sheet, when a solid part of a recorded image on the image-forming layer is measured by a visual filter, a ratio of a reflection optical density to a layer thickness (unit: μm) of the image-forming layer is 0.15 or more.

4. The laser thermal transfer multicolor image forming material according to claim 1, wherein in the image-forming layer of the white thermal transfer sheet, the ratio of a reflection optical density to a layer thickness (unit: μm) of the image-forming layer is 0.16 or more.

5. The laser thermal transfer multicolor image forming material according to claim 3, wherein the image-forming layer of the white thermal transfer sheet has a thickness of 2.0 μm or less.

6. The laser thermal transfer multicolor image forming material according to claim 3, wherein the image-forming layer of the white thermal transfer sheet has a thickness of 1.5 μm or less.

7. The laser thermal transfer multicolor image forming material according to claim 1, wherein the light-to-heat conversion layer contains at least one of a polyamideimide resin and a polyimide resin.

8. The laser thermal transfer multicolor image forming material according to claim 1, wherein the light-to-heat conversion layer contains a polyamideimide resin binder and a cyanine dye having a sulfonic acid group.

* * * * *